(12) United States Patent
Chuang et al.

(10) Patent No.: US 11,935,918 B2
(45) Date of Patent: Mar. 19, 2024

(54) HIGH VOLTAGE DEVICE WITH BOOSTED BREAKDOWN VOLTAGE

(71) Applicant: Taiwan Semiconductor Manufacturing Company, Ltd., Hsinchu (TW)

(72) Inventors: Harry-Hak-Lay Chuang, Zhubei (TW); Hsin Fu Lin, Hsinchu County (TW); Tsung-Hao Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 104 days.

(21) Appl. No.: 17/572,945

(22) Filed: Jan. 11, 2022

(65) Prior Publication Data

US 2022/0406886 A1    Dec. 22, 2022

Related U.S. Application Data

(60) Provisional application No. 63/212,955, filed on Jun. 21, 2021.

(51) Int. Cl.
| | |
|---|---|
| *H01L 29/06* | (2006.01) |
| *H01L 21/762* | (2006.01) |
| *H01L 21/768* | (2006.01) |
| *H01L 23/48* | (2006.01) |
| *H01L 29/78* | (2006.01) |

(52) U.S. Cl.
CPC .... *H01L 29/0607* (2013.01); *H01L 21/76283* (2013.01); *H01L 21/76898* (2013.01); *H01L 23/481* (2013.01); *H01L 29/7824* (2013.01)

(58) Field of Classification Search
CPC ........... H01L 21/76898; H01L 27/1203; H01L 29/78648; H01L 29/0653
See application file for complete search history.

(56) References Cited

U.S. PATENT DOCUMENTS

| | | | |
|---|---|---|---|
| 9,761,525 B1* | 9/2017 | Hook | ................. H01L 29/7832 |
| 2019/0109232 A1 | 4/2019 | Goktepeli et al. | |
| 2019/0393340 A1* | 12/2019 | Liang | ................. H01L 29/0865 |
| 2020/0259016 A1 | 8/2020 | Mori | |

* cited by examiner

*Primary Examiner* — Raj R Gupta
(74) *Attorney, Agent, or Firm* — Eschweiler & Potashnik, LLC

(57) ABSTRACT

An integrated circuit (IC) device comprises a high voltage semiconductor device (HVSD) on a frontside of a semiconductor body and further comprises an electrode on a backside of the semiconductor body opposite the frontside. The HVSD may, for example, be a transistor or some other suitable type of semiconductor device. The electrode has one or more gaps directly beneath the HVSD. The one or more gaps enhance the effectiveness of the electrode for improving the breakdown voltage of the HVSD.

20 Claims, 36 Drawing Sheets

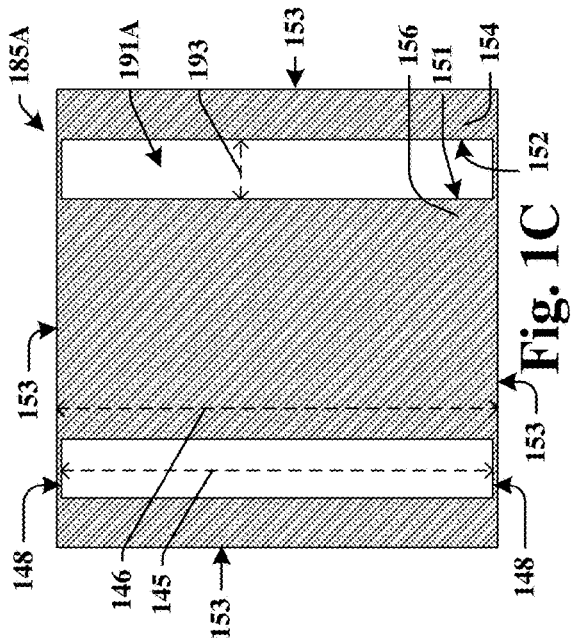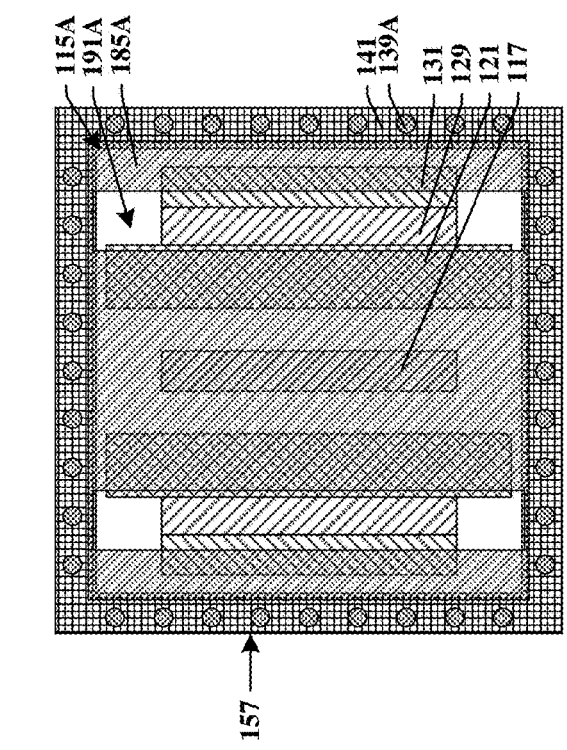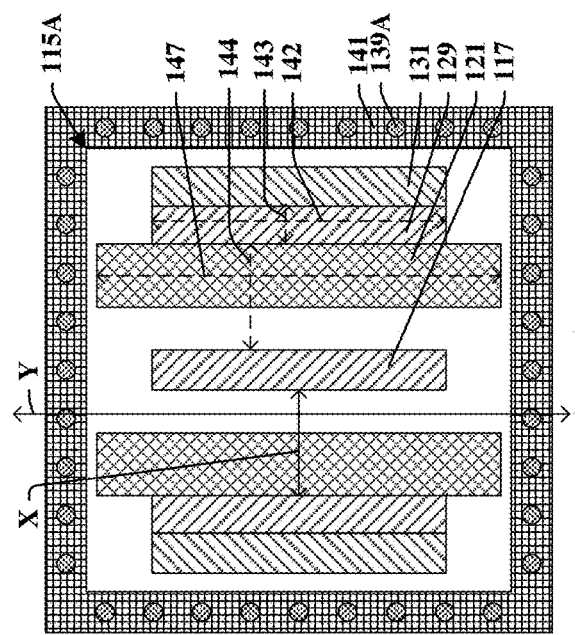

3500

- 3501 Form DTI Structures
- 3503 Form Lightly Doped Wells
- 3505 Form STI Structures
- 3507 Form Medium Doped Wells
- 3509 Form Gates
- 3511 Form Heavily Doped Contact Regions
- 3513 Form Metal Interconnect
- 3515 Thin Substrate
- 3517 Form The Isolation Layer
- 3519 Form Backside Conductive Layer
- 3521 Form Backside ILD Layer
- 3523 Pattern Backside Conductive Layer
- 3525 Fill Openings in Conductive Layer
- 3527 Etch Holes For TSVs
- 3529 Etch Electrode Via Openings
- 3531 Deposit TSV And Backside Metal
- 3533 Pattern Backside Metal
- 3535 Form Backside Contacts

Fig. 35

HIGH VOLTAGE DEVICE WITH BOOSTED BREAKDOWN VOLTAGE

REFERENCE TO RELATED APPLICATION

This Application claims the benefit of U.S. Provisional Application No. 63/212,955, filed on Jun. 21, 2021, the contents of which are hereby incorporated by reference in their entirety.

BACKGROUND

Modern day integrated chips comprise millions or billions of semiconductor devices formed on a semiconductor substrate (e.g., silicon). Integrated circuit (IC) devices (chips) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a plan view of a high voltage semiconductor device and some surrounding structures within the IC device of FIG. 1A according to some embodiments of the present disclosure.

FIG. 1C is a plan view of a backside electrode with a gap according to some embodiments of the present disclosure.

FIG. 1D combines the elements of FIG. 1B and FIG. 1C in a superimposed plan view representative of the IC device of FIG. 1A.

FIGS. 35-37 provide flow charts illustrating some processes according to the present disclosure for forming IC devices according to the present disclosure.

DETAILED DESCRIPTION

Figure 1A:
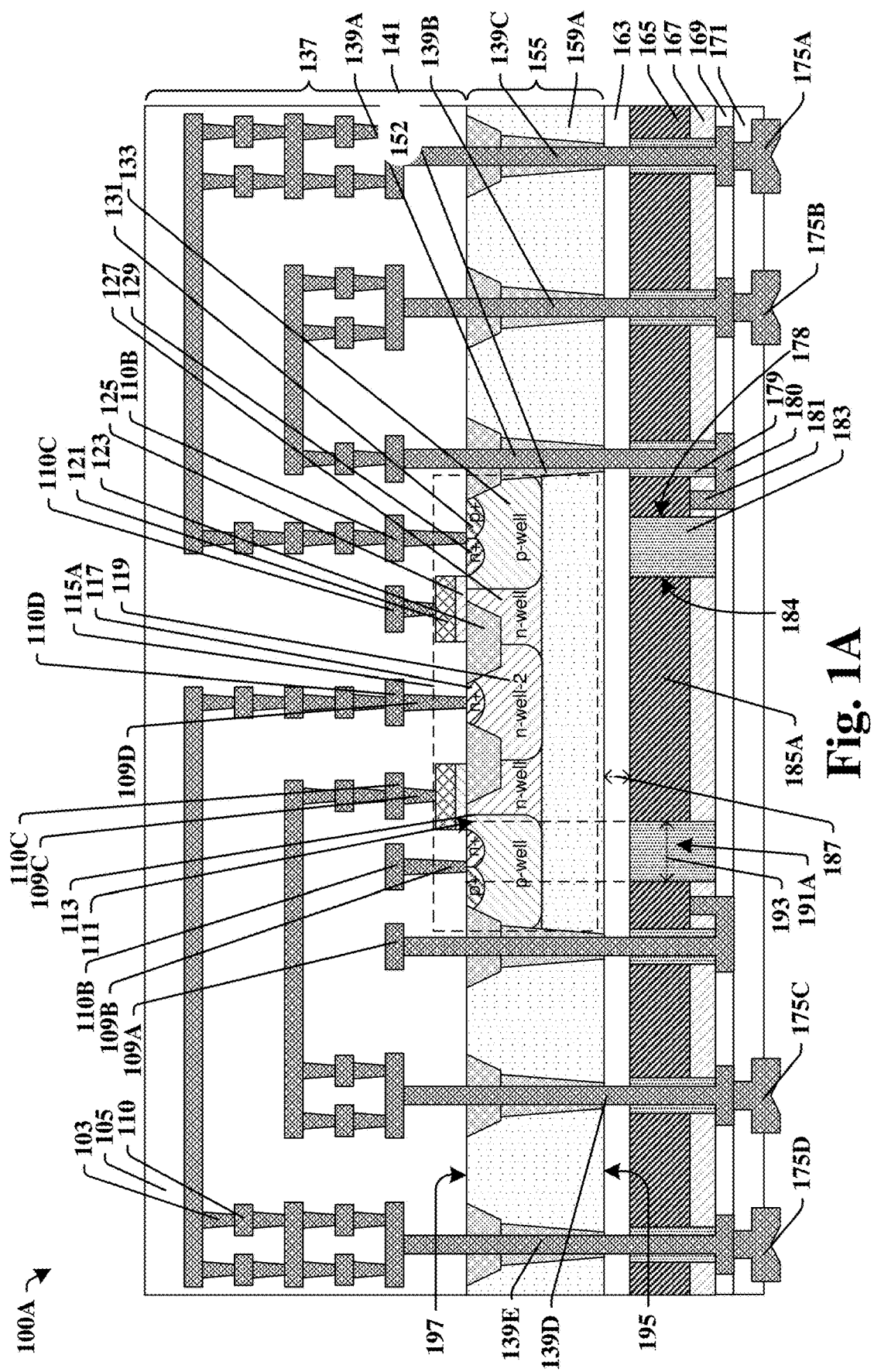
FIG. 1A illustrates a cross-sectional side view of an integrated circuit (IC) device comprising a high voltage semiconductor device according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) device may include high voltage semiconductor devices (HVSDs), such as high voltage transistors. An HVSD may have a breakdown voltage greater than about 20 Volts (V), for example, a breakdown voltage in the range from about 50V to about 113V. Implementing HVSDs on a silicon on insulator (SOI) substrate may improve performance by reducing latch-up, increasing packing density, and reducing leakage current. A further improvement may be realized by implementing the reduced surface field (RESURF) concept using an electrode on a backside of the substrate, where an insulating layer separates the electrode from a semiconductor body in which the HVSD is formed. The electrode may be grounded or held at a suitable bias voltage and may improve a breakdown voltage of the associated HVSD. The improvement may include an increase in an absolute value of the breakdown voltage.

In accordance with some aspects of the present disclosure, a backside electrode directly beneath an HVSD has one or more gaps directly beneath the HVSD. The one or more gaps enhance the effectiveness of the backside electrode for improving the breakdown voltage of the HVSD. The location and number of gaps in the backside electrode that is most effective may vary according to the HVSD size and doping.

In some embodiments, the one or more gaps are cut-outs within the backside electrode. Accordingly, in some embodiments a first portion of the backside electrode is on one side of a gap and a second portion of the electrode is on an opposite side of the gap. In some embodiments, the first portion and the second portion are joined together. In some embodiments, the backside electrode completely surrounds the gap. The gaps may have widths less than half a width of the HVSD. In some embodiments, a solid portion of the backside electrode covers a majority of the area directly beneath the HVSD.

An HVSD may be any type of metal oxide semiconductor field effect transistor (MOSFET), bipolar junction transistor (BJT), PN diode, other high voltage semiconductor device, combination thereof, or the like. In some embodiments, the HVSD is completely surrounded by a deep trench isolation (DTI) structure. In some embodiments, the DTI structure extends from a front side to a backside of a semiconductor body in which the HVSD is formed. In some embodiments, the HVSD may be identified as the collection of semiconductor device structures surrounded by a single DTI structure.

In some embodiments, the gap has a shape corresponding to a shape of a structure such as a well region, a source region, a drain region, a gate electrode, or the like of the HVSD. The backside electrode may be directly beneath the structure such as the well region, the source region, the drain region, the gate electrode, or the like to which the shape of the backside electrode corresponds. In some of these embodiments, the source region or the drain region is ring shaped and the gap is also ring shaped. In some embodiments, the HVSD has a source region and a drain region that are elongated in a direction transverse to a source-to-drain direction. In some of these embodiments, the one or more gaps are also elongated in the transverse direction. In some of these embodiments, the one or more gaps have a transverse extent that is greater than transverse extents of the source region and the drain region. Note that a transverse extent may, for example, correspond to a dimension in the transverse direction. The backside electrode may have a transverse extent that is greater than the transverse extent of the gap(s), whereby the backside electrode extends across one or both transverse ends of the gap(s). A gap with these structural characteristics may improve electrical field uniformity in the HVSD.

In some embodiments, the IC device has a plurality of HVSDs that are equivalent in dimensions and doping and their corresponding backside electrodes have a pattern that is repeated for each of the plurality of HVSDs. The pattern is such that each of the backside electrodes extends over some but not all of a footprint of a corresponding HVSD. The incomplete coverage may be described in terms of one or more gaps in each of the backside electrodes. In some embodiments, the gaps are directly beneath drain regions of the HVSDs. In some embodiments, the gaps are directly beneath PN junctions that include the drain regions of the HVSDs. In some embodiments, the gaps are directly beneath source regions of the HVSDs. In some embodiments, the gaps are directly beneath PN junctions that include the source regions of the HVSDs. In some embodiments, the gaps are directly beneath gate electrodes of the HVSDs on a front side of the substrate. In some embodiments, the gaps are directly beneath channels of the HVSDs. In some embodiments, the gaps are directly beneath n-wells of the HVSDs. In some embodiments, the gaps are directly beneath p-wells of the HVSDs. In some of these embodiments, the HVSDs are transistors. The numbers and locations of the gaps may be determined in relationship to the HVSD structure for HVSDs of a particular type, size, and doping.

In some embodiments, an HVSD is surrounded by a deep trench isolation (DTI) structure that extends through a full thickness of the semiconductor body in which the HVSD is formed. In some embodiments, a backside electrode for the HVSD extends beneath the DTI structure. In some embodiments, the backside electrode is entirely within an outer perimeter of the DTI structure. In some embodiments, a metal interconnect structure is disposed on the front side of the semiconductor body. In some embodiments, a through-substrate via (TSV) extends through the semiconductor body. In some embodiments, the TSV connects the backside electrode to the metal interconnect structure. In some embodiments, the TSV passes through the DTI structure. In some embodiments, the backside electrode is connected to a contact pad through which the backside electrode may be grounded or held to a predetermined voltage. In some embodiments, the backside electrode is connected to a contact pad so that a voltage on the backside electrode is continuously variable with a voltage on the contact pad.

In some embodiments, logic devices are formed in the same semiconductor body as HVSDs. In some embodiments, the IC device comprises a plurality of substrates. In some embodiments, a second substrate is connected to the front side. In some embodiments, a second substrate is connected to the backside. In some embodiments, additional substrates are connected to the front side and to the backside. In some embodiments, the IC device is a binary-CMOS-DMOS (BCD) device. In the BCD device, HVSDs and low density logic devices may be formed on a first substrate whereas other types of devices may be formed on distinct substrates that are connected to the first substrate.

Some aspects of the present disclosure relate to methods of forming an IC device. In accordance with these methods, an HVSD is formed on a front side of a semiconductor body. In some embodiments, an insulating layer and a conductive layer are formed on a backside of the semiconductor body. In some embodiments, the conductive layer is a metal layer. The conductive layer is patterned to form an electrode with an opening directly beneath the HVSD. The electrode may be connected to a contact pad and used to improve a breakdown voltage of the HVSD. In some embodiments, the connection to the contact pad comprises a TSV. In some embodiments, the electrode is patterned after the TSV is formed. In some embodiments, the electrode with the opening is formed by a damascene process.

FIG. 1A illustrates a cross-sectional view of an IC device 100A according to some aspects of the present disclosure. The IC device 100A comprises a device layer 155 comprising a semiconductor body 159A having a front side 197 and a backside 195. A metal interconnect structure 137 is disposed on the front side 197. An insulating layer 163 and a conductive layer 165 are disposed on the backside 195 with the insulating layer 163 separating the conductive layer 165 from the semiconductor body 159A. A high voltage semiconductor device (HVSD) 115A is formed in the semiconductor body 159A adjacent the front side 197. The conductive layer 165 forms a backside electrode 185A having gaps 191A directly beneath the HVSD 115A. The gaps 191A are filled with non-conductive material such as the dielectric 183. The backside electrode 185A has a first sidewall 178 and a second sidewall 184 on either side of each of the gaps 191A. The first sidewall 178 and the second sidewall 184 are directly beneath the HVSD 115A and are separated by the dielectric 183.

FIG. 1B illustrates a plan view of the HVSD 115A and some surrounding structures. FIG. 1C is a plan view of the backside electrode 185A. FIG. 1D combines the views of FIG. 1B and FIG. 1C to show the geometric relationship between the locations of the HVSD 115A and its component structures, and the location of the backside electrode 185A and its gaps 191A. The gaps 191A may alternately be described as openings or spaces in the backside electrode 185A.

In the illustrated examples, the HVSDs are lateral doubly diffused metal oxide semiconductor (LDMOS) devices and use shallow trench isolation (STI). More particularly, the HVSDs in the examples are all high voltage transistors. The HVSDs, however, may be any type of metal-oxide-semiconductor field-effect transistor (MOSFET), bipolar junction transistor (BJT), PN diode, other high voltage semiconductor device, combination thereof, or the like and may use other types of isolation structures.

The HVSD 115A comprises a drain region 117, two source regions 129, and two gate electrodes 121. The drain region 117 is a heavily n-doped area of the semiconductor body 159A disposed between two STI structures 123. The source regions 129 are heavily n-doped areas within p-wells 133. The p-wells 133 are separated from the drain region 117 by n-wells 127 and an n-well 119. The n-wells 127 and the n-well 119 are drift regions that improve the breakdown voltage. The gate electrodes 121 are disposed on the front side 197 adjacent the source regions 129. The gate electrodes 121 overlie PN junctions 113 between the p-wells 133 and the n-wells 127 and may partially overlie the STI structures 123. Areas of the p-wells 133 that are directly below the gate electrodes 121 provide channels 111. A gate dielectric 125 is disposed between the gate electrodes 121 and the channels 111. The semiconductor body 159A may be lightly p-doped. A voltage of the semiconductor body 159A may be regulated through body contact regions 131 that are heavily p-doped.

The HVSD 115A has a footprint corresponding to an area surrounded by a deep trench isolation (DTI) structure 141 that surrounds the HVSD 115A. In accordance with some embodiments, the DTI structure 141 extends from the front side 197 to the backside 195. The backside electrode 185A, exclusive of the gaps 191A, extends over half or more of the footprint of the HVSD 115A. In some embodiments, the backside electrode 185A extends over 75% of the footprint. In some embodiments, each of the gaps 191A extends over 25% or less of the footprint. In some embodiments, each of the gaps 191A extends over 15% or less of the footprint.

With reference to FIG. 1B, the source regions 129, the drain region 117, and the gate electrodes 121 are each elongated in a direction Y that is transverse to a direction X, which is a source-to-drain direction for the HVSD 115A. The gaps 191A are likewise elongated in the direction Y. In accordance with some embodiments, a length 145 of the gaps 191A in the direction Y is greater that a length 142 of the source regions 129 and the drain region 117 in the direction Y. Also, the length 145 of the gaps 191A in the direction Y is greater that a length 147 of the gate electrodes 121 in the direction Y. In accordance with some embodiments, the gaps 191A extend under the DTI structure 141 and thus outside the footprint of the HVSD 115A. Making the gaps 191A at least this long may improve electrical field uniformity within the HVSD 115A.

With reference to FIG. 1C, the backside electrode 185A has a transverse extent 146 that is greater than the length 145 of the gaps 191A. The transverse extent is the length in a dimension transverse to the source-to-drain direction (e.g., the direction X). The gaps 191A are located inside a perimeter 153 of the backside electrode 185A. Accordingly, a first portion 154 of the backside electrode 185A is on one side 152 of a gap 191A and a second portion 156 of the backside electrode 185 is on an opposite side 151 of the gap 191A. The first portion 154 and the second portion 156 may be united at the transverse ends 148 of the gaps 191A whereby the backside electrode 185A surrounds the gaps 191A. Although the backside electrode 185A may be divided into a plurality of sections by the gaps 191A, having the backside electrode 185A united into one piece may improve electrical field uniformity.

In some embodiments, the gaps 191A are directly beneath the p-wells 133 within which the heavily n-doped source regions 129 are disposed. In some embodiments, the gaps 191A are entirely beneath the p-wells 133. In some embodiments, the gaps 191A are directly beneath the source regions 129. These gap locations are distal with respect to the drain region 117, which is a high voltage region. Simulations have shown the largest improvement in breakdown voltage when the gaps 191A are distal with respect to the high voltage region of a high voltage device similar to the HVSD 115A.

With reference to FIGS. 1C and 1D, in some embodiments, the backside electrode 185A extends underneath the DTI structure 141 and thus outside the footprint of the HVSD 115A. Making the gaps 191A at least this long may improve electrical field uniformity within the HVSD 115A. In some embodiments, the backside electrode 185A is within an outer perimeter 157 of the DTI structure 141. In accordance with some embodiments, an area within the perimeter 153 of the backside electrode 185A, which is an area of the backside electrode 185A including the gaps 191A, is greater than the footprint of the HVSD 115A. In some embodiments, the area within the perimeter 153 is between 100% and 150% of the footprint of the HVSD 115A. In some embodiments, the area within the perimeter 153 is between 100% and 120% the footprint of the HVSD 115A. Making the area of the backside electrode 185A greater than the footprint of the HVSD 115A may improve the electrical field uniformity within the HVSD 115A. If the area of the backside electrode 185A is too great the backside electrode 185A may take up an excessive amount of chip area. Moreover, through substrate vias (TSVs) 139A may be disposed within the DTI structure 141 around the backside electrode 185A. A size of the backside electrode 185A may be limited to leave room for the TSVs 139A to be disposed with the DTI structure 141.

In some embodiments, the width 193 of the gaps 191A is at least half a width 143 (see FIG. 1B) of the source regions 129 in the source-to-drain direction X. In some embodiments, the width 193 of the gaps 191A is at least equal to the width 143 of the source regions 129. In some embodiments, the gaps 191A are no more than twice the width 143. In some embodiments, the gaps 191A are smaller than the source-to-drain distance 144. Having the gaps 191A within these limits may provide the largest improvement in breakdown voltage.

The width 193 of the gaps 191A may vary in relation to a thickness 187 of the insulating layer 163. In some embodiments, the thickness 187 of the insulating layer 163 is from about 0.1 µm to about 10 µm. In some embodiments, the thickness 187 is from about 0.5 µm to about 3 µm. In some embodiments, the thickness 187 is from about 1 µm to about 2 µm.

In some embodiments, the width 193 of the gaps 191A is from one to ten times the thickness 187. In some embodiments, the width 193 is from one to five times the thickness 187. In some embodiments, the width 193 is from about 0.1 µm to about 20 µm. In some embodiments, the width 193 is from about 0.5 µm to about 5 µm. In some embodiments, the width 193 is from about 1 µm to about 2 µm. Having the width 193 of the gaps 191A within these limits may provide the largest improvement in breakdown voltage.

With reference to FIG. 1A, the backside electrode 185A may be connected to a contact pad 175B through which the backside electrode 185A may be grounded or held to a predetermined voltage. In some embodiments, the contact pad 175B is on the backside 195. In some embodiments the backside electrode 185A is connected to the contact pad 175B through the metal interconnect structure 137. Alternatively, the contact pad 175B may be on the front side 197 or the backside electrode 185A may be connected to the contact pad 175B directly without using any connections to the metal interconnect structure 137 or any other structure on the front side 197.

In some embodiments, the backside electrode 185A is connected to the metal interconnect structure 137 through one or more TSVs 139A. Alternatively, the backside electrode 185A may be connected to the metal interconnect structure 137 through polypiping, which may be provided as a ring of polysilicon with the DTI structure 141 around the HVSD 115A. As shown in FIG. 1B, the TSVs 139A may be distributed around the HVSD 115A and may be separated from the HVSD 115A by the deep trench isolation structure 141. The TSVs 139A may be connected to the backside electrode 185A through conductive lines 180 and vias 181 on the backside 195. In some embodiment, the backside electrode 185A is a unitary structure. If the backside electrode 185A is divided into two or more pieces by the gaps 191A, the conductive lines 180 and the vias 181 may connect one or more of the TSVs 139A to each piece.

The metal interconnect structure 137 includes conductive lines 110 and vias 103 within an interlayer dielectric (ILD) 105. An ILD may comprise one or more layers of materials such as low-k dielectrics (e.g., a dielectric material with a dielectric constant less than about 3.9), oxides (e.g., $SiO_2$), nitrides (e.g., SiN), carbides (e.g., SiC), oxy-nitrides (e.g., SiON), oxy-carbides (e.g., SiOC), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

All the TSVs 139A associated with the HVSD 115A and the backside electrode 185A may be connected to one another and to a single contact pad 175B through the metal interconnect structure 137. In particular, the TSVs 139A may connect to conductive lines 109A and, through various conductive lines 110 and vias 103, further connect to a TSV 139B that connects to the contact pad 175B on the backside 195.

The two source regions 129 and the two gate electrodes 121 may respectively be connected together through the metal interconnect structure 137 so that the HVSD 115A is operated as a single transistor. In particular, the source regions 129 may be connected to conductive lines 110B through contact plugs 109B. The conductive lines 110B may be united and, through various conductive lines 110 and vias 103, further connect to a TSV 139C that connects to a contact pad 175A on the backside 195. The gate electrodes 121 may be connected to conductive lines 110C through contact plugs 109C. The conductive lines 110C may be united and, through various conductive lines 110 and vias 103, further connect to a TSV 139D that connects to a contact pad 175C on the backside 195. The drain region 117 may be connected to a conductive line 110D through a contact plug 109D. The conductive line 110D may be further connected through various conductive lines 110 and vias 103 to a TSV 139E that connects to a contact pad 175D on the backside 195.

Figure 2:
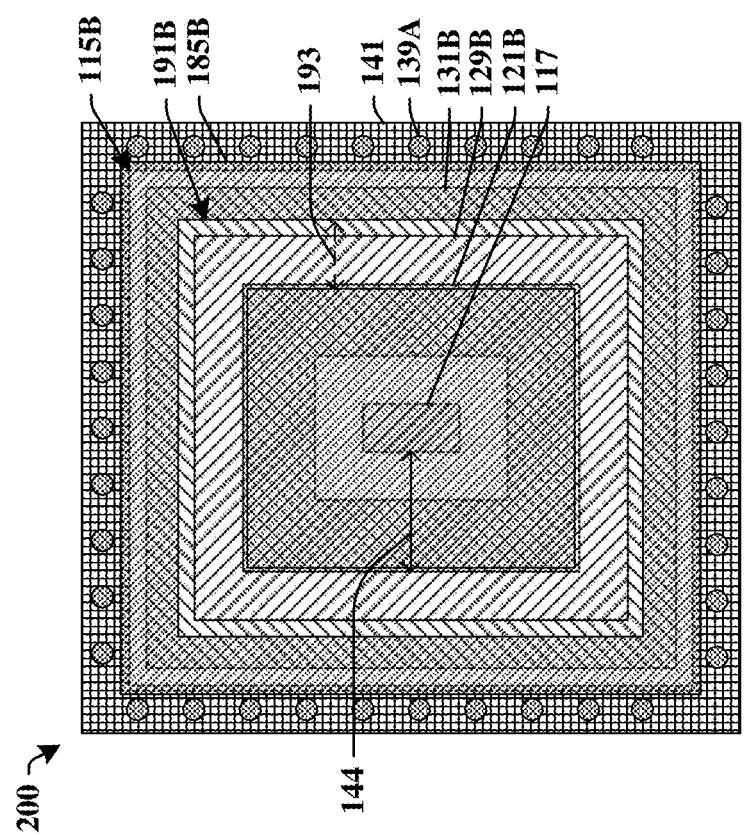
FIG. 2 is a plan view showing an alternate layout for the high voltage semiconductor device of the IC device of FIG. 1A.

FIG. 2 provides a plan view 200 illustrating an HVSD 115B and an associated backside electrode 185B. The HVSD 115B is like the HVSD 115A but has an alternate layout that may be used in the IC device 100A or any of the other examples of the present disclosure. In the HVSD 115B, the gate electrode 121B, the source region 129B, and the body contact regions 131B are ring-shaped. The gap 191B of the backside electrode 185B is likewise ring-shaped. The source-to-drain distance 144 may be the same as for the backside electrode 185A Likewise, the width 193 of the gap 191B may be the same as for the gaps 191A. The gaps 191B may be entirely surrounded by the DTI structure 141 without limiting the uniformity of the electric field.

Figure 3:
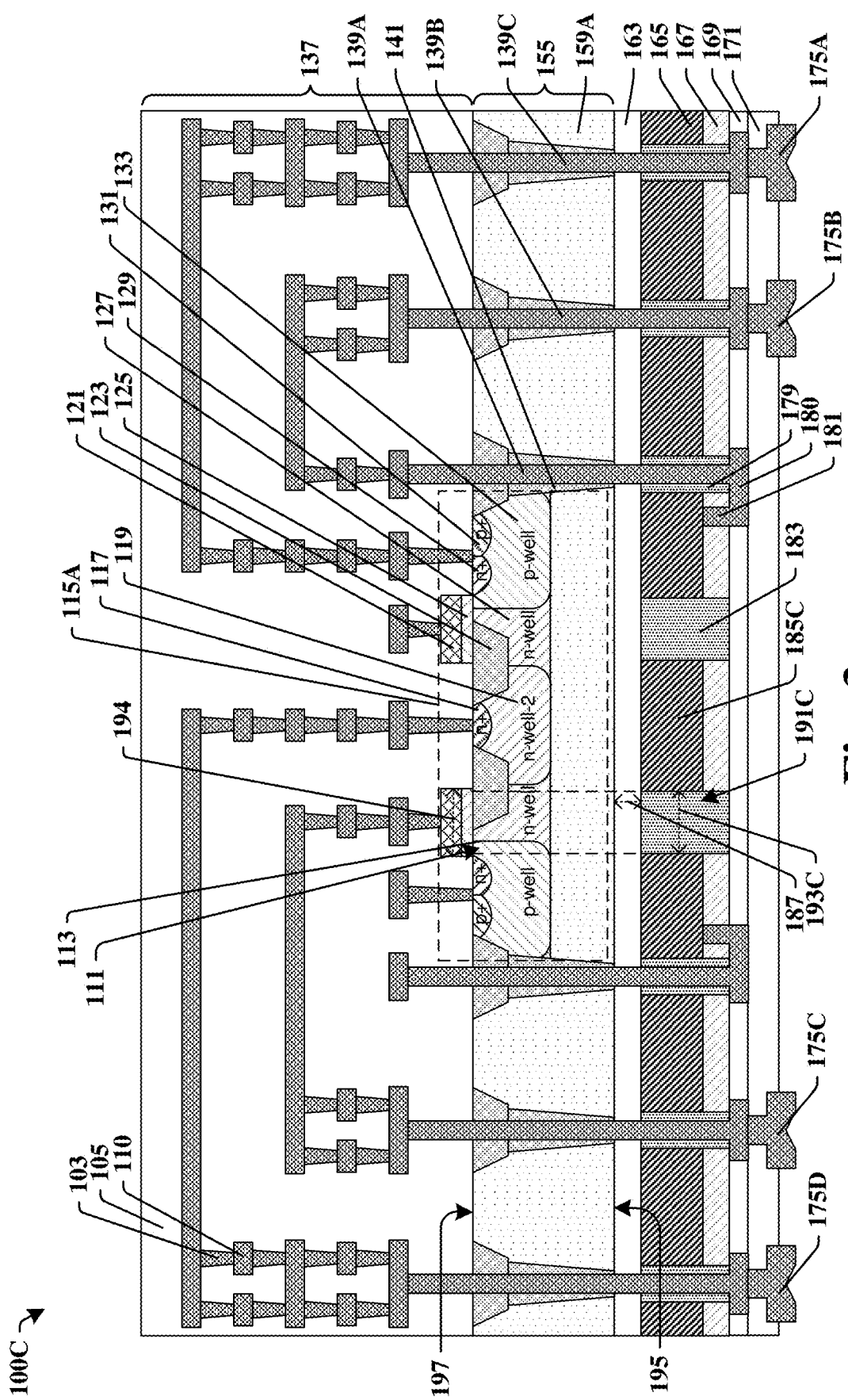
FIGS. 3-9 illustrate cross-sectional side views of integrated circuit (IC) devices according to various aspects of the present disclosure.

FIG. 3 provides a cross-sectional side view of an IC device 100C in accordance with some other embodiments of the present disclosure. The IC device 100C is like the IC device 100A but has a backside electrode 185C having gaps 191C. The gaps 191C are directly beneath the gate electrodes 121. In some embodiments, the gaps 191C are as narrow or narrower than the gate electrodes 121. In some embodiments, a width 193C of the gaps 191C is entirely within a footprint of the gate electrodes 121. In some embodiments, the width 193C is greater than a width 194 of the gate electrodes 121. In some embodiments, a footprint of the gate electrodes 121 is entirely within the gaps 191C. As used herein, a footprint is a two-dimensional projection in a plane parallel to an upper surface of a semiconductor body.

Figure 4:
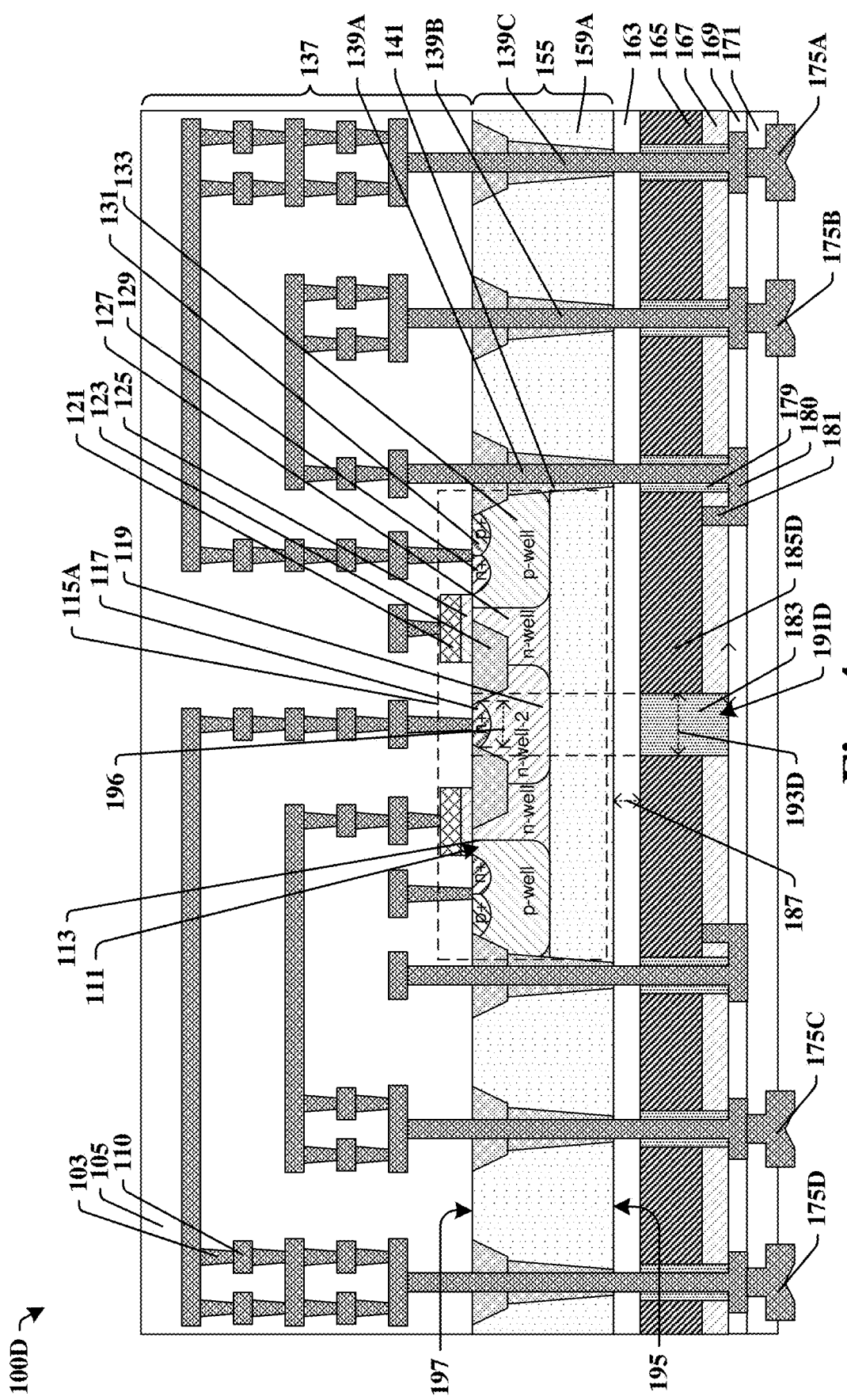

FIG. 4 provides a cross-sectional side view of an IC device 100D in accordance with some other embodiments of the present disclosure. The IC device 100D is like the IC device 100A but has a backside electrode 185D having a gap 191D. The gap 191D is directly beneath the drain region 117. In some embodiments, the gap 191D is as narrow or narrower than the drain region 117. In some embodiments, a width 193D of the gap 191D is entirely within a footprint of the drain region 117. In some embodiments, the width 193D is greater than a width 196 of the drain region 117. In some embodiments, a footprint of the drain region 117 is entirely within the gap 191D.

Figure 5:
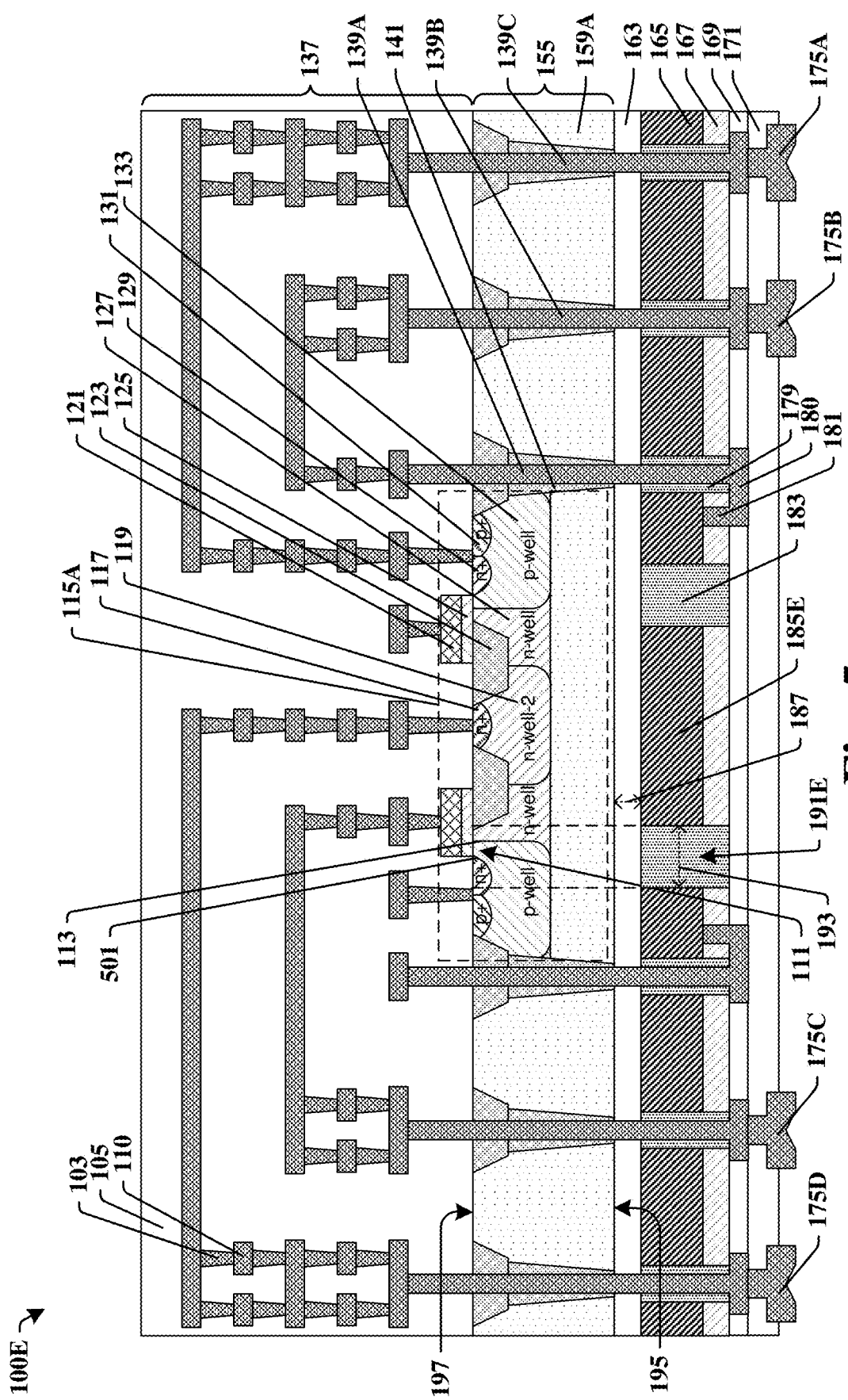

FIG. 5 provides a cross-sectional side view of an IC device 100E in accordance with some other embodiments of the present disclosure. The IC device 100E is like the IC device 100A but has a backside electrode 185E having gaps 191E. The gaps 191E are directly beneath the channels 111. In some embodiments, the gaps 191E are as narrow or narrower than the channels 111. In some embodiments, a footprint of the channels 111 is entirely within the gaps 191E. In some embodiments, portions of the gaps 191E are directly beneath the gate electrodes 121 and portions of the gaps 191E are directly beneath the source regions 129. In some embodiments, the gaps 191E are directly beneath PN junctions 501. The PN junctions 501 are junctions between the source regions 129 and the channels 111. In some embodiments, the gaps 191E extend from directly beneath PN junctions 501 to directly beneath PN junctions 113.

The embodiments of FIGS. 3-5 provide various relationships between structures in the HVSD 115A and the sizes, locations, and numbers of gaps in a corresponding backside electrode. Each of these relationships may be particularly suited to a particular implementation of the HVSD 115A, with the relationship that is most suitable being determined by the size of the HVSD 115A, the doping types and concentrations in the HVSD 115A, the isolation structures used in the HVSD 115A, and the operating voltage of the HVSD 115A.

Figure 6:
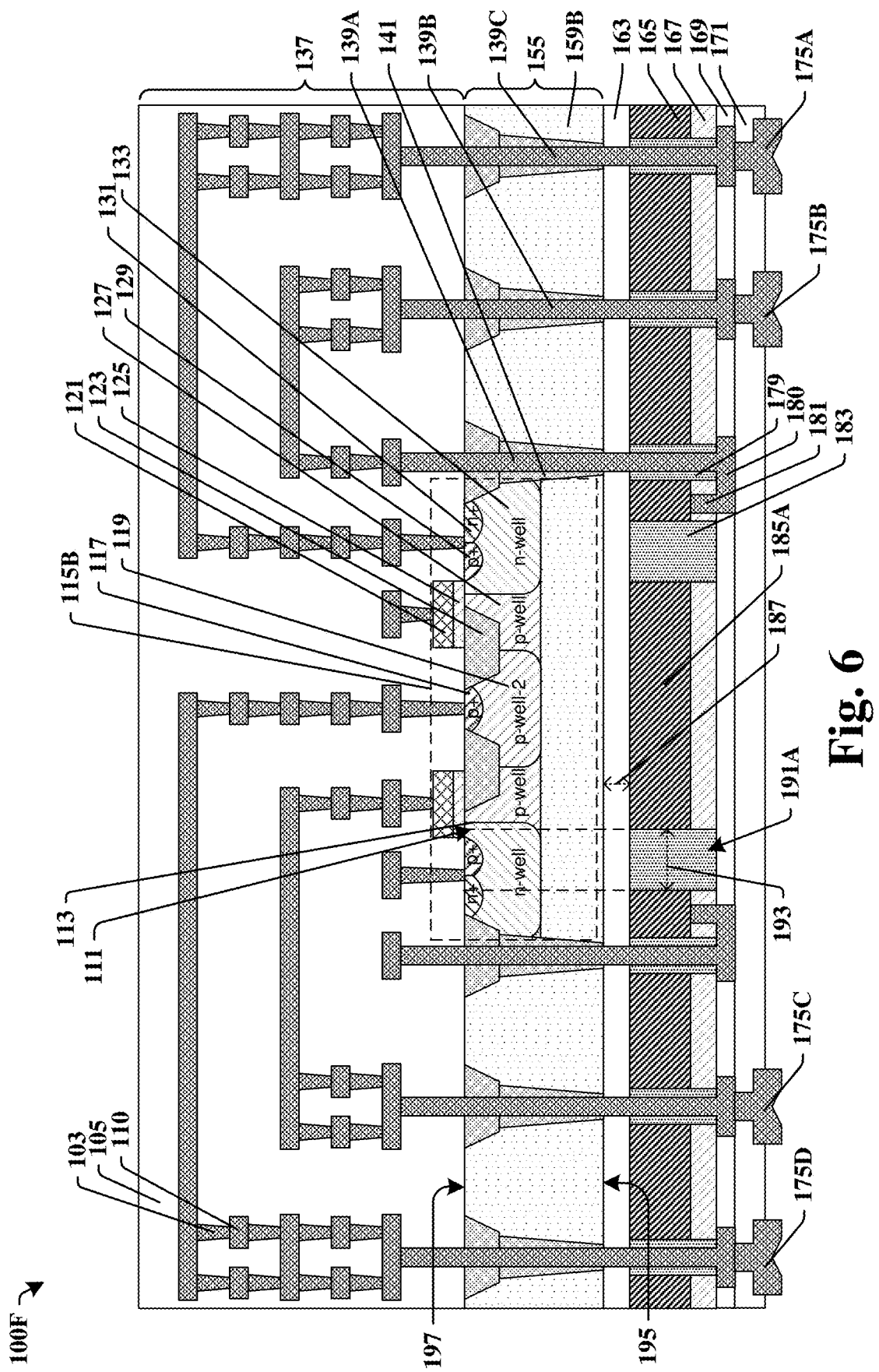

The IC devices 100A, 100C, 100D, and 100E all include the HVSD 115A, which is an n-channel laterally diffused metal-oxide semiconductor (n-LDMOS) transistor. FIGS. 6-9 illustrate IC devices 100F-100I that have corresponding structures but opposite doping types. FIG. 6 illustrates an IC device 100F that is like the IC devices 100A but has a semiconductor body 159B that is lightly n-doped and an HVSD 115B. The HVSD 115B is like the HVSD 115A but has opposite doping types to provide a p-channel laterally diffused metal-oxide semiconductor (p-LDMOS) transistor.

Figure 7:
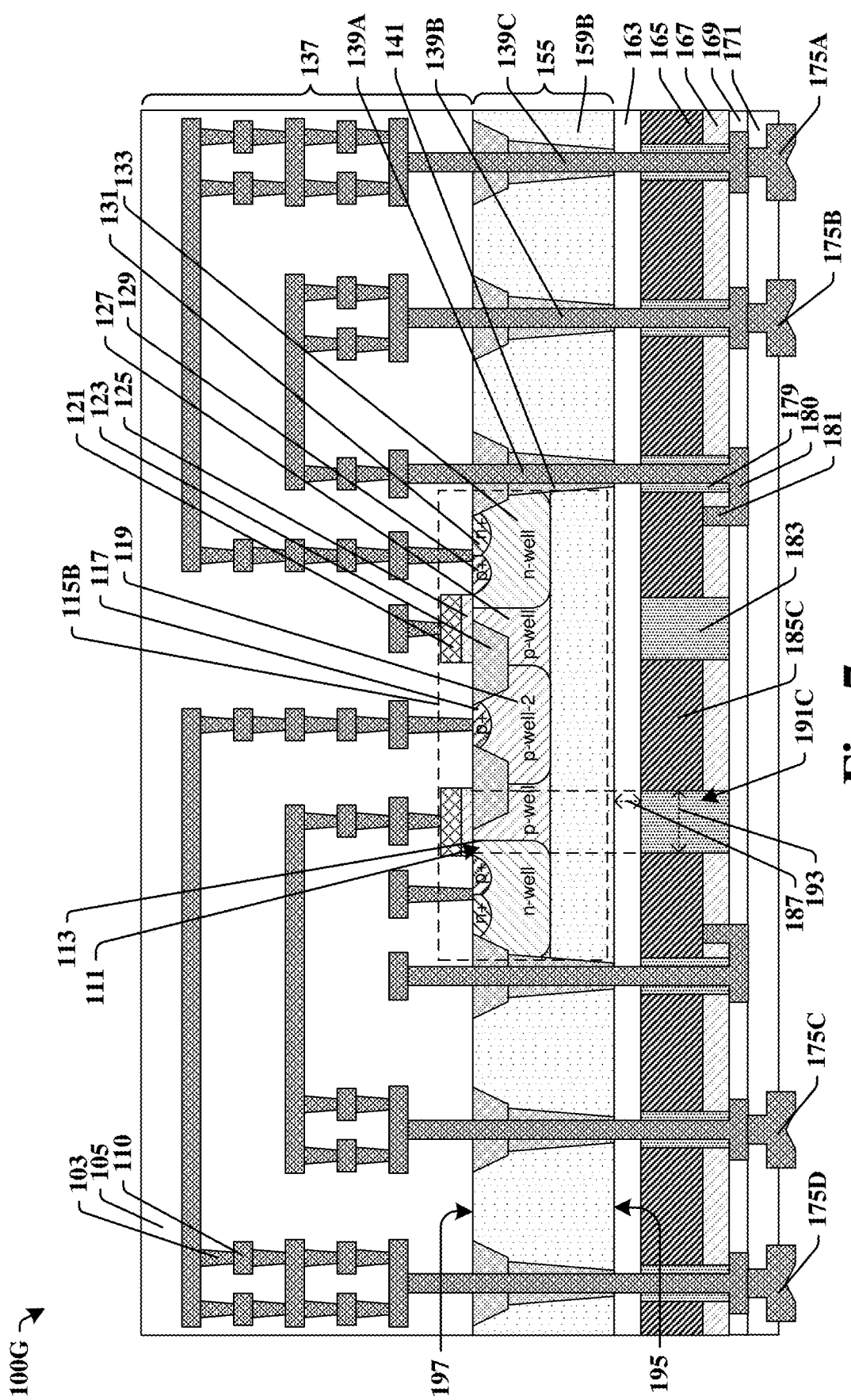
Figure 8:
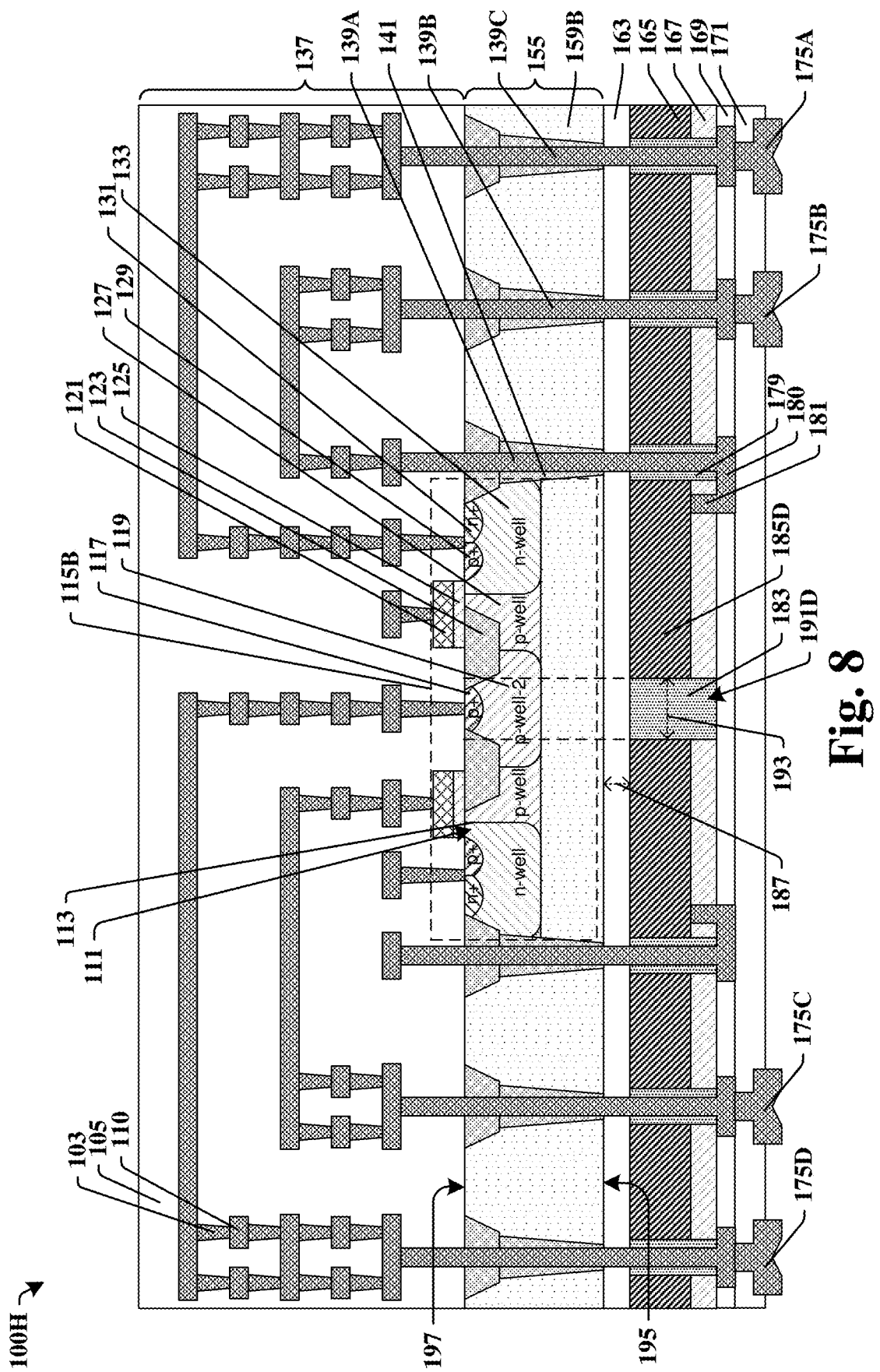
Figure 9:
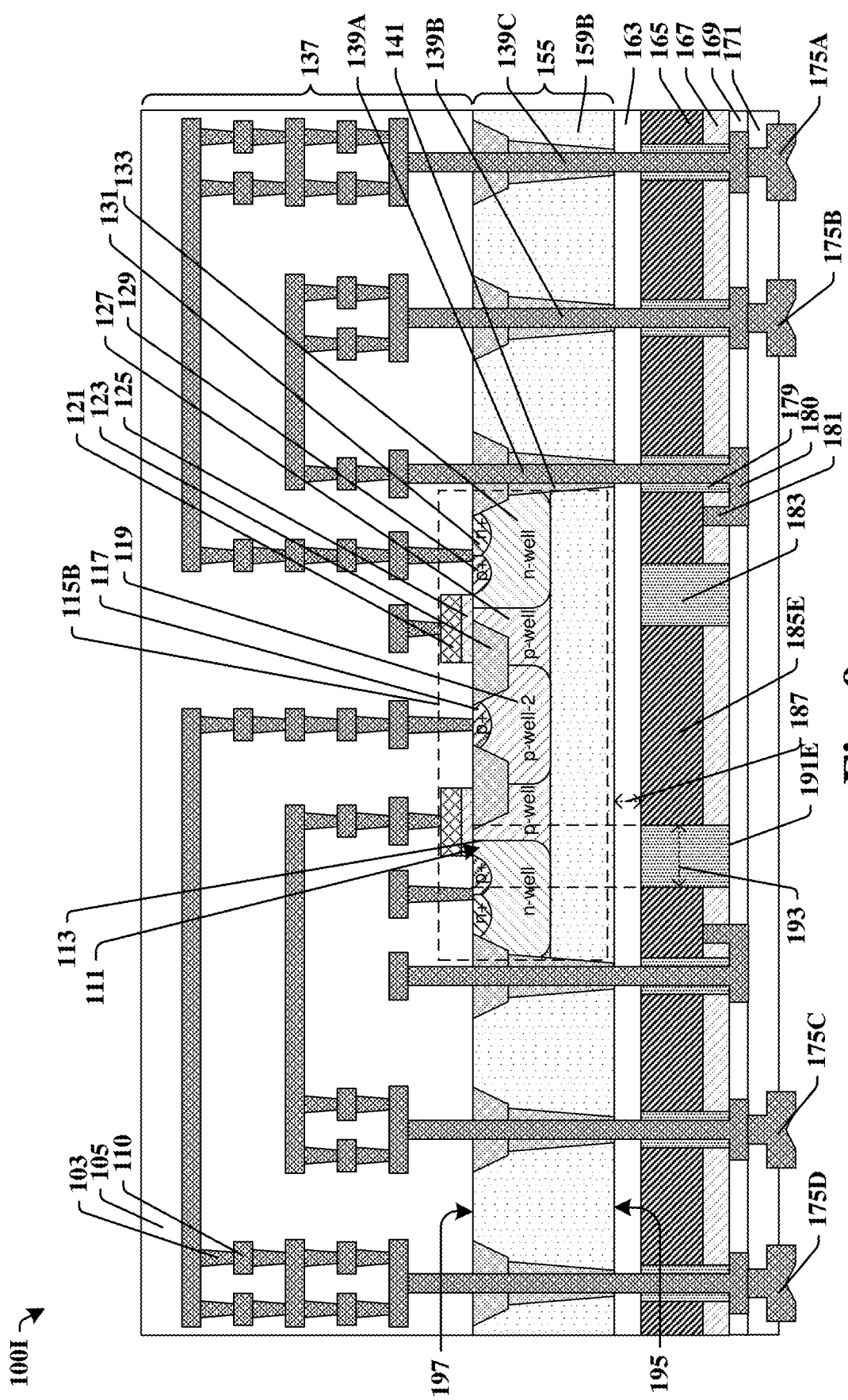

FIG. 6 illustrates an IC device 100F that is like the IC devices 100A of FIG. 1A but has the semiconductor body 159B in place of the semiconductor body 159A and the HVSD 115B in place of the HVSD 115A. FIG. 7 illustrates an IC device 100G that is like the IC devices 100C of FIG. 3 but has the semiconductor body 159B and the HVSD 115B. FIG. 8 illustrates an IC device 100H that is like the IC devices 100D of FIG. 4 but has the semiconductor body 159B and the HVSD 115B. FIG. 9 illustrates an IC device 100I that is like the IC devices 100E of FIG. 5 but has the semiconductor body 159B and the HVSD 115B.

FIGS. 10 through 22 are cross-sectional view illustrations exemplifying a method according to the present disclosure of forming an IC device having an HVSD and an associated backside electrode with one or more gaps according to the present disclosure. While FIGS. 10 through 22 are described with reference to various embodiments of a method, it will be appreciated that the structures shown in FIGS. 10 through 22 are not limited to the method but rather may stand alone separate from the method. While FIGS. 10 through 22 are described as a series of acts, it will be appreciated that the order of the acts may be altered in other embodiments. While FIGS. 10 through 22 illustrate and describe a specific set of acts, some acts that are illustrated and/or described may be omitted in other embodiments. Further, acts that are not illustrated and/or described may be included in other embodiments. While the method of FIGS. 10 through 22 is described in terms of forming the IC device 100A of FIG. 1A, the method may be used to form other IC devices.

Figure 10:
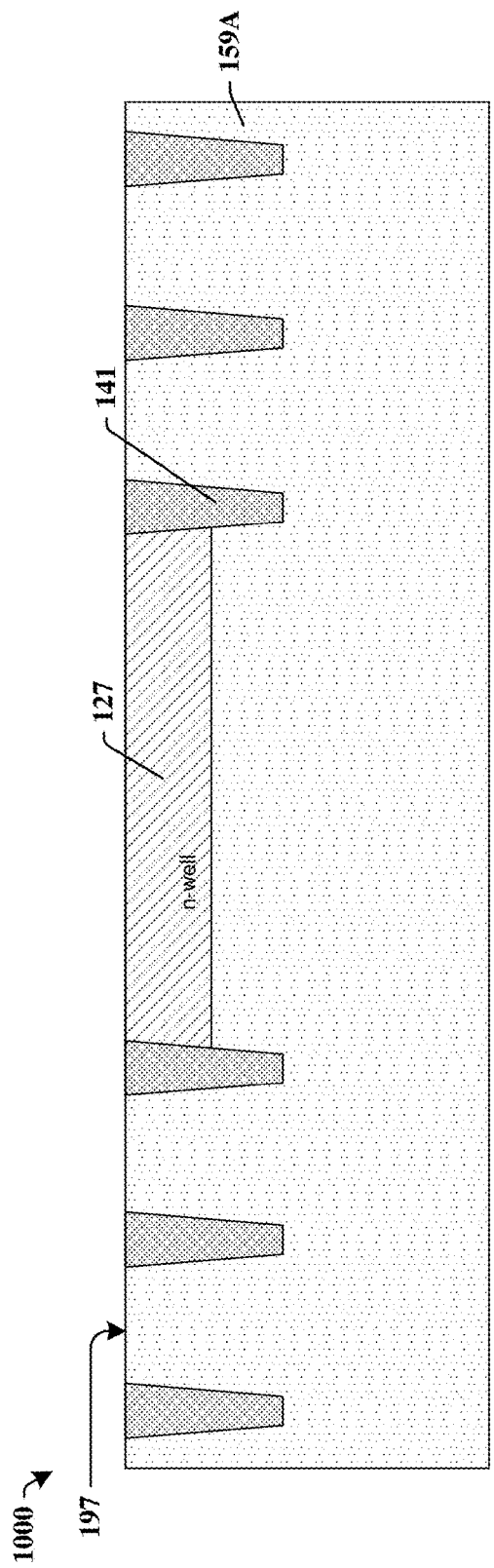
FIGS. 10-22 illustrate in a series of cross-sectional views a method according to the present disclosure of forming an IC device such as the IC device of FIG. 1A.

As shown by the cross-sectional view 1000 of FIG. 10, the method may begin with forming the DTI structures 141 and the n-well 127 in the semiconductor body 159A. The semiconductor body 159A comprises a semiconductor, which may be, for example, silicon (Si), germanium (Ge), silicon-germanium (SiGe), gallium arsenide (GaAs), some other semiconductor material, a combination of the foregoing, or the like. In some embodiments the semiconductor body 159A is p-doped to a concentration within a range from about $10^{14}$ to about $10^{16}$ atoms/cm$^3$. In some embodiments the n-well 127 is n-doped to a concentration within a range from about $10^{15}$ to about $10^{17}$ atoms/cm$^3$. The DTI structures 141 may be formed by etching trenches in the semiconductor body 159A and filling the trenches with dielectric. The trenches may have sidewalls that are angled or substantially vertical. The dielectric may be or comprise, for example, an oxide (e.g., SiO$_2$), a nitride (e.g., SiN), an oxy-nitride (e.g., SiON), a carbide (e.g., silicon carbide (SiC)), a combination thereof, or the like. The n-well 127 may be doped before or after forming the DTI structures 141.

Figure 11:
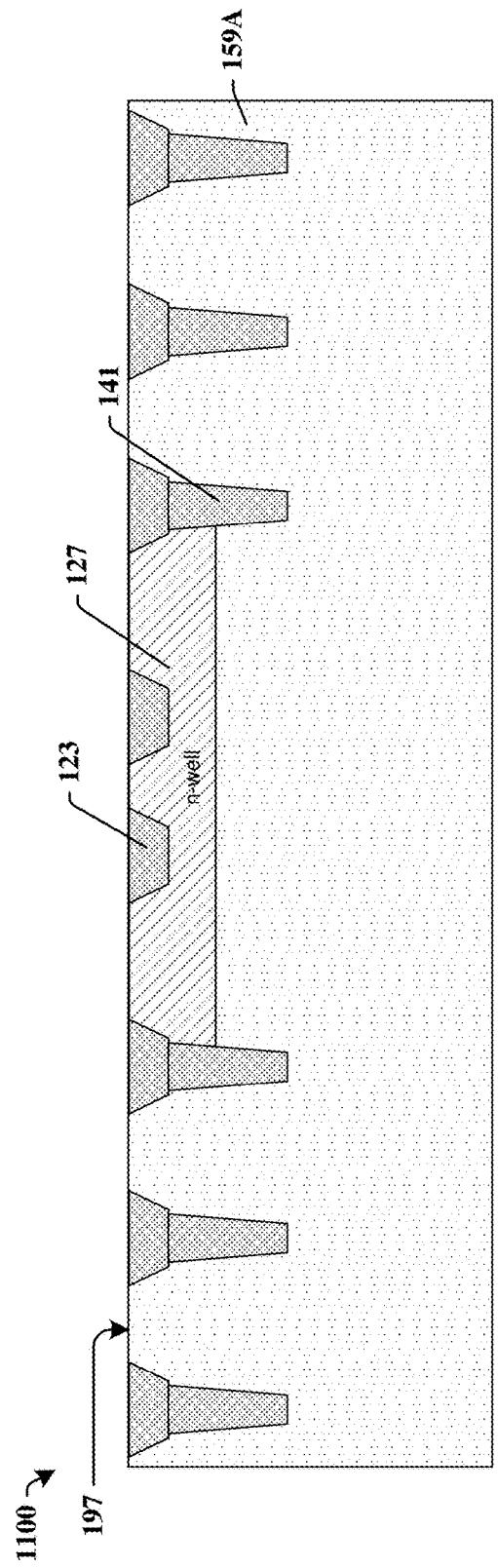

As shown by the cross-sectional view 1100 of FIG. 11, the method may continue with forming the STI structures 123. The STI structures 123 may be formed by etching trenches in the semiconductor body 159A and filling the trenches with dielectric. The trenches may have sidewalls that are angled or substantially vertical. The dielectric may be or comprise, for example, an oxide (e.g., SiO$_2$), a nitride (e.g., SiN), an oxy-nitride (e.g., SiON), a carbide (e.g., silicon carbide (SiC)), a combination thereof, or the like. Some of the STI structures 123 may be formed directly over DTI structures 141.

Figure 12:
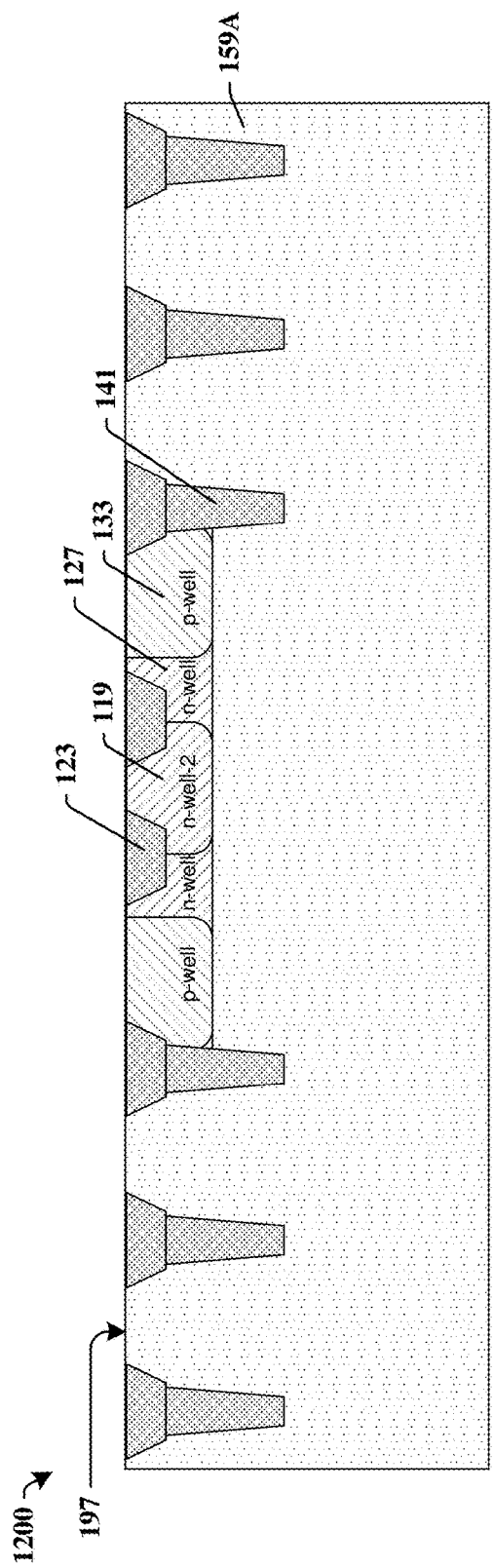

As shown by the cross-sectional view 1200 of FIG. 12, additional doping may be carried out to form the n-well 119 and the p-wells 133. The STI structures 123 and photoresist masks may be used to align these dopings. In some embodiments, the n-well 119 is doped more heavily than the n-well 127. In some embodiments the n-well 119 is n-doped to a concentration within a range from about $10^{17}$ to about $10^{18}$ atoms/cm$^3$. In some embodiments the p-wells 133 are p-doped to a concentration within a range from about $10^{17}$ to about $10^{18}$ atoms/cm$^3$.

Figure 13:
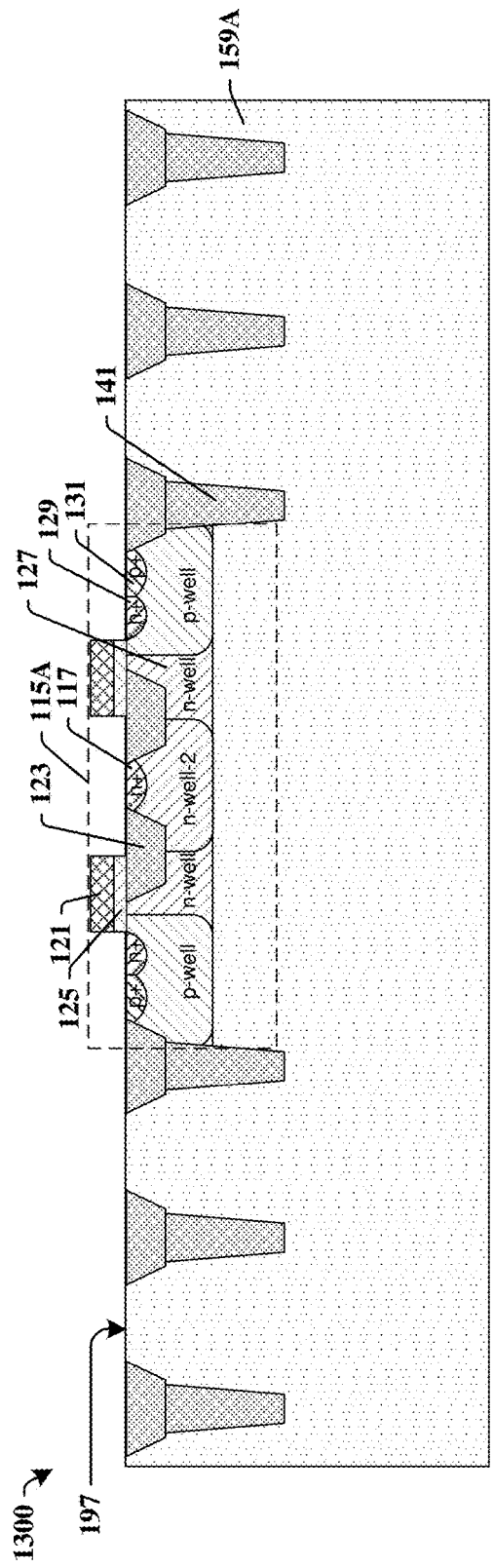

As shown by the cross-sectional view 1300 of FIG. 13, the method may continue with formation of the gate dielectrics 125, the gate electrodes 121, the drain region 117, the source regions 129, and the body contact regions 131 to complete formation of the HVSD 115A. The process may include forming and patterning a gate stack that include a gate dielectric layer and a gate electrode layer. In some embodiments, the gate electrode layer is or comprises polysilicon or the like. In such embodiments, the gate dielectric layer may be or comprise, for example, an oxide (e.g., silicon dioxide (SiO$_2$)) or the like. In some other embodiments, the gate electrode layer may be or comprise a metal, such as aluminum (Al), copper (Cu), titanium (Ti), tantalum (Ta), tungsten (W), molybdenum (Mo), cobalt (Co), or the like. In such embodiments, the gate dielectric layer may be or comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like.

The gate electrodes 121, any associated sidewall spacers (not shown), the STI structures 123, and one or more photoresists (not shown) may provide masks for doping the drain region 117, the source regions 129, and the body contact regions 131. The source regions 129 and the drain regions 117 may be n-doped to a concentration of about $10^{20}$ atoms/cm$^3$ or greater. The body contact regions 131 may be p-doped to a concentration of about $10^{20}$ atoms/cm$^3$ or greater. The foregoing actions may all be part of front-end-of-line (FEOL) processing.

Figure 14:
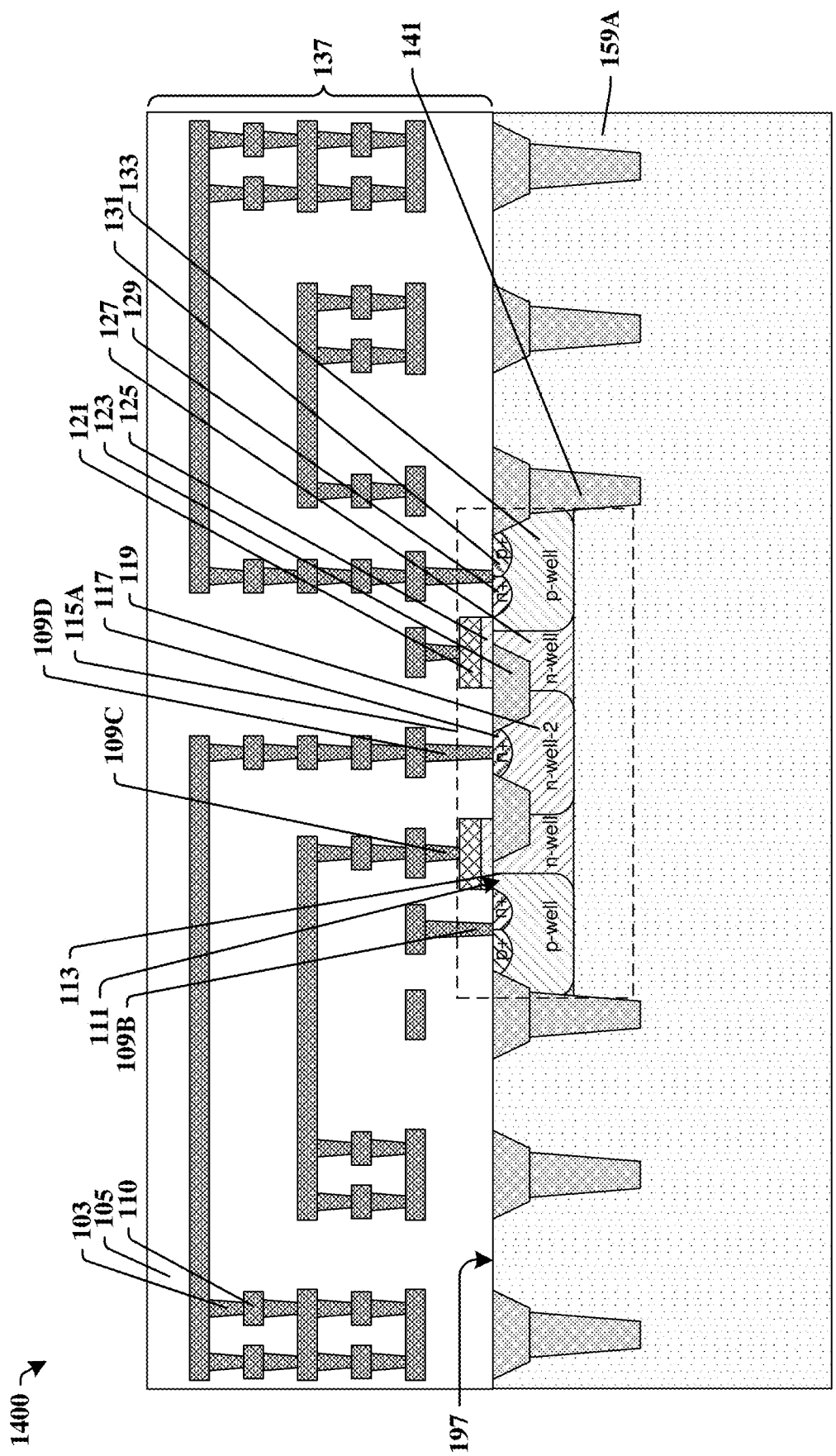

As shown by the cross-sectional view 1400 of FIG. 14, the method may continue with back-end-of-line (BEOL) processing and the formation of the metal interconnect structure 137. Forming the metal interconnect structure 137 may include a series of damascene or dual damascene processes. The processing includes formation of contact plugs 109B, 109C, and 109D, conductive lines 110, and vias 103. The contact plugs 109B, 109C, and 109D may be or comprise, for example, tungsten (W), copper (Cu), aluminum (Al), or the like. The contact plugs 109B may connect to both body contact regions 131 and source regions 129. The conductive lines 110 and the vias 103 may be or comprise, for example, copper (Cu), aluminum (Al), gold (Au), silver (Ag), platinum (Pt), or the like.

Figure 15:
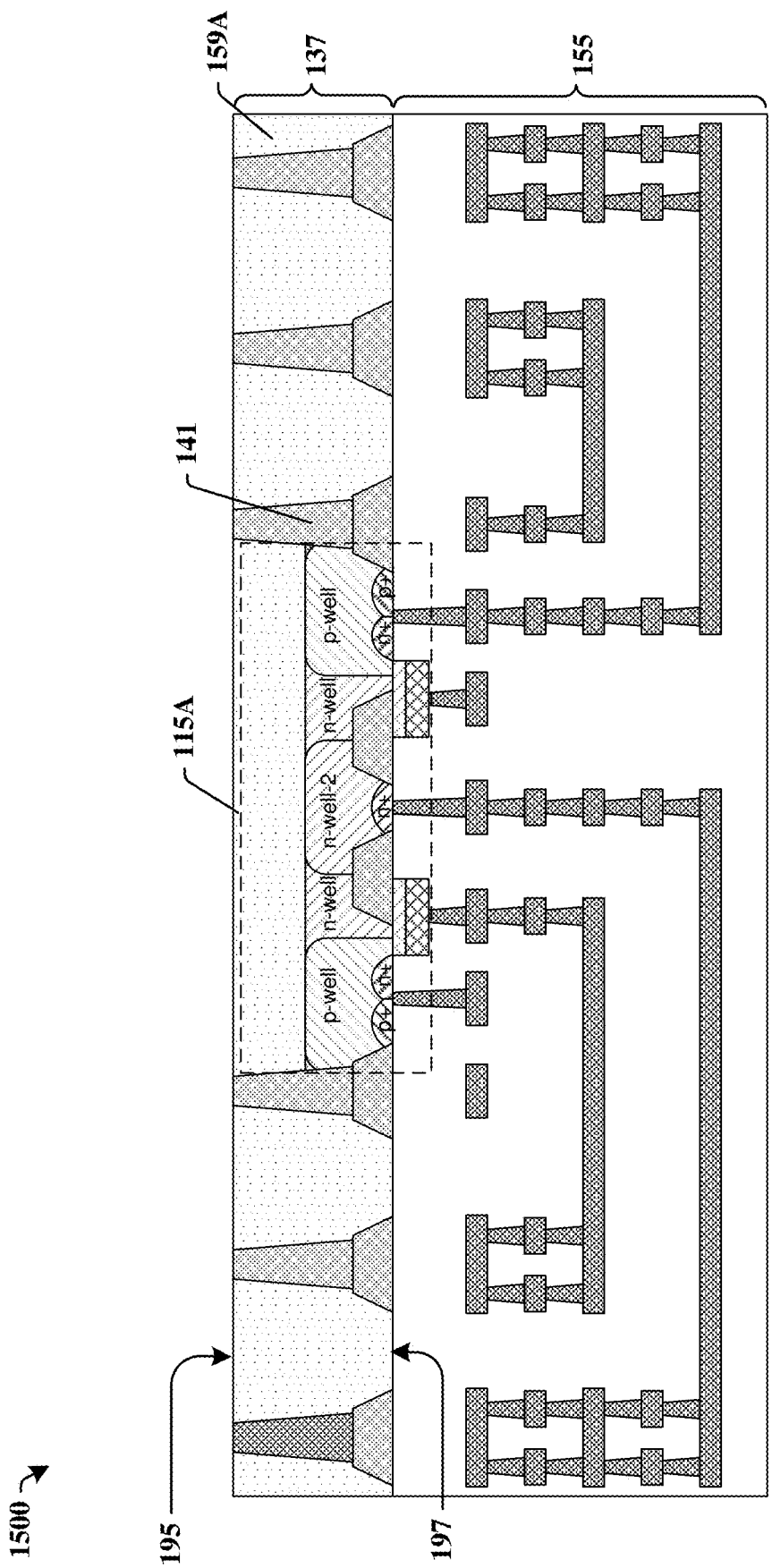

As shown by the cross-sectional view 1500 of FIG. 15, at this stage of processing the workpiece including the semiconductor body 159A may be flipped over and the method may continue with thinning the semiconductor body 159A to the device layer 155. After thinning the semiconductor body 159A, the DTI structures 141 extend to the backside 195, which is now on top. The thinning process may be or comprise, for example, chemical mechanical polishing (CMP), mechanical grinding, an etching, a combination of the foregoing, or the like. Prior to thinning, the semiconductor body 159A may have a thickness of about 750 µm, for example. In some embodiments, after thinning the semiconductor body 159A has a thickness in a range from about 2 µm to about 15 µm.

Figure 16:
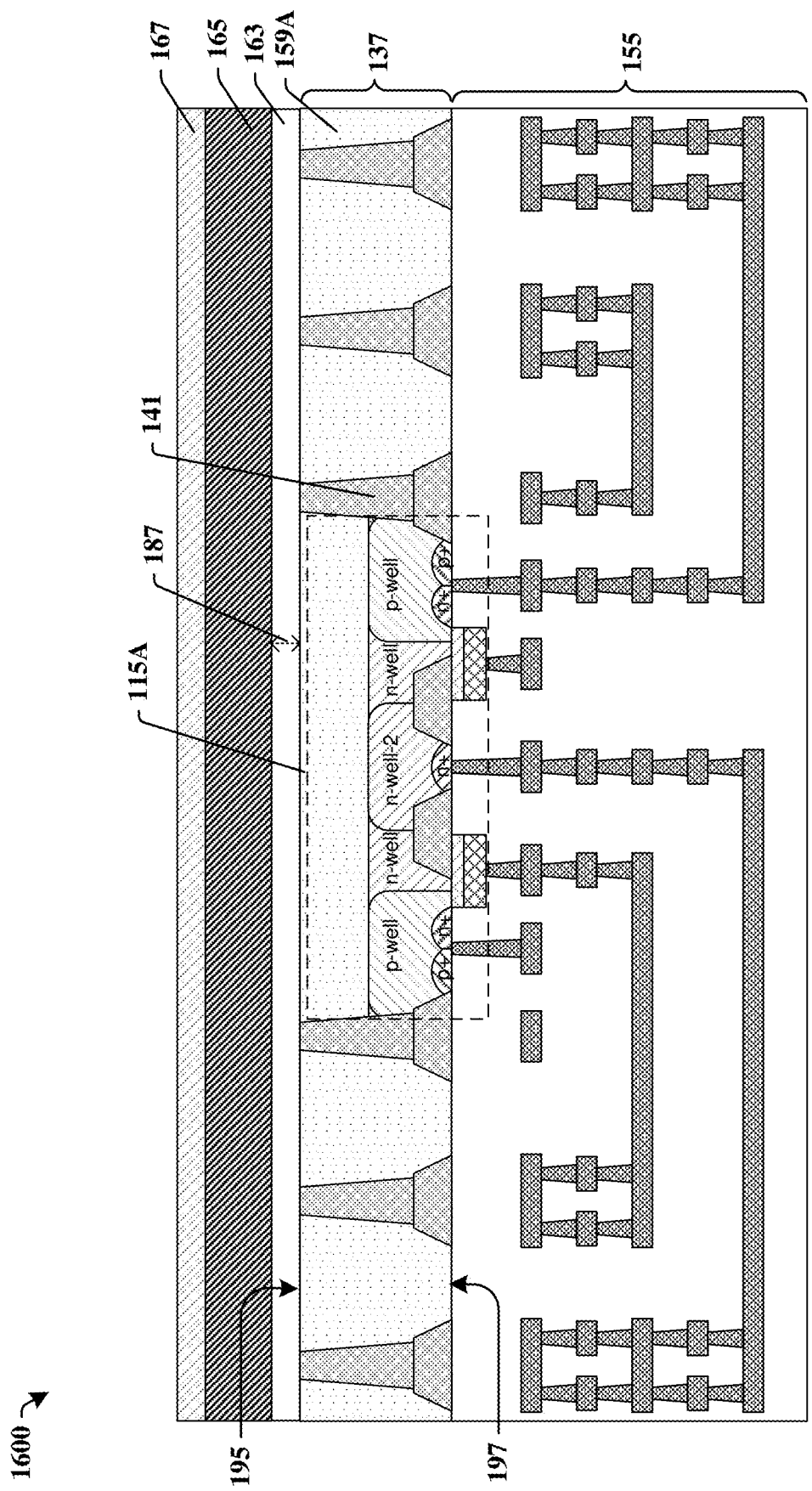

As shown by the cross-sectional view 1600 of FIG. 16, the method may continue with formation of the insulating layer 163, the conductive layer 165, and an ILD layer 167 on the backside 195. The insulating layer 163 and the ILD layer 167 may be formed by chemical vapor deposition (CVD), physical vapor deposition (PVD), a spin-on process, any other suitable process, combination thereof, or the like. The conductive layer 165 may be formed by CVD, PVD, electroplating plating, electroless plating, some other deposition process, a combination thereof, or the like.

The insulating layer 163 may be or comprise a low-k dielectric (e.g., a dielectric material with a dielectric constant less than about 3.9), a high-k dielectric material (e.g., a dielectric material with a dielectric constant greater than about 3.9, such as, hafnium oxide (HfO), tantalum oxide (TaO), hafnium silicon oxide (HfSiO), hafnium tantalum oxide (HMO), aluminum oxide (AlO), zirconium oxide (ZrO), or the like), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), some other dielectric material, a combination of the foregoing, or the like.

The conductive layer 165 may be any conductive material such as a metal, a heavily doped semiconductor such as heavily doped polysilicon, a conductive carbon-based material such as graphene, or the like. In some embodiments, the conductive layer 165 comprises a metal. The metal may be copper (Cu), aluminum (Al), tungsten (W), gold (Au), silver (Ag), platinum (Pt), a combination thereof or the like. In some embodiments, the conductive layer 165 is copper (Cu), aluminum (Al), copper-aluminum alloy (CuAl), or the like. In some embodiments, the conductive layer 165 has a thickness from about 1 µm to about 5 µm.

Figure 17:
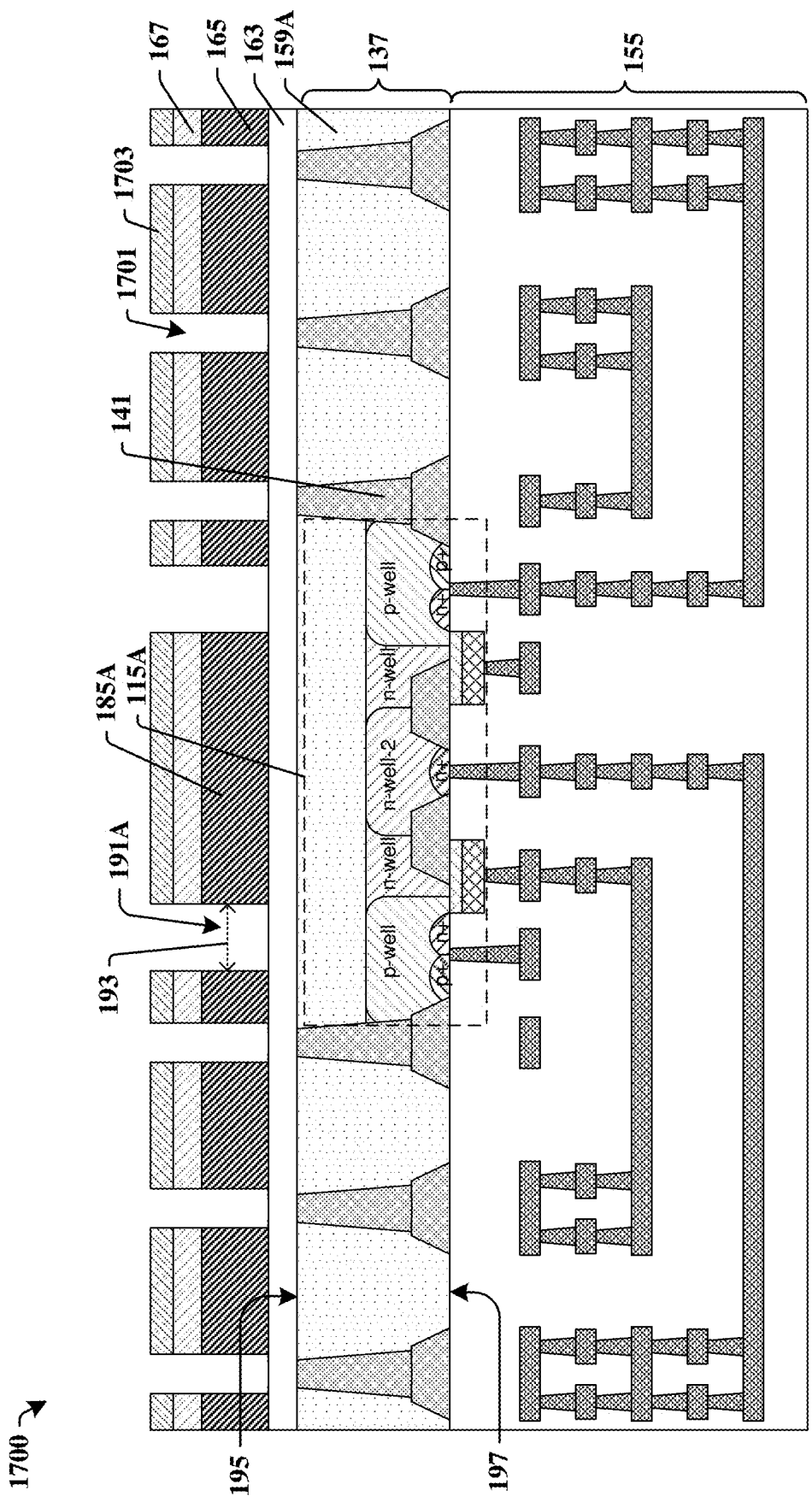

As shown by the cross-sectional view 1700 of FIG. 17, a mask 1703 may be formed and used to pattern the conductive layer 165. The mask 1703 may be formed by photolithography. Patterning may include wet etching, dry etching, reactive ion etching (RIE), some other etching process, a combination of the foregoing, or the like. The etching may stop in or on the insulating layer 163. Patterning may form the backside electrode 185A from the conductive layer 165. Patterning may also form the gaps 191A in the backside electrode 185A and the openings 1701 through which TSVs will pass through the conductive layer 165. The openings 1701 may be aligned to DTI structures 141. After etching, the mask 1703 may be stripped.

Figure 18:
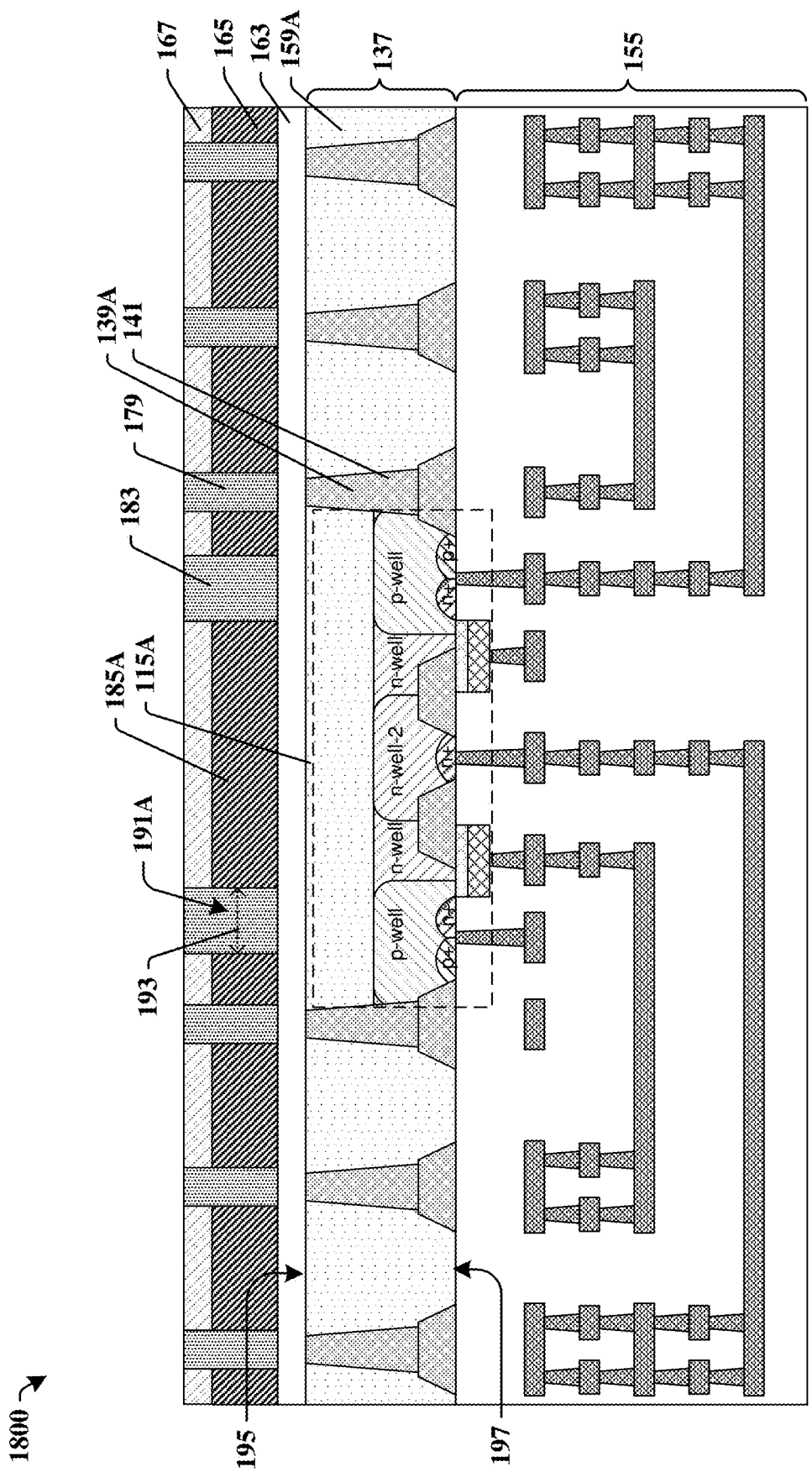

As shown by the cross-sectional view 1800 of FIG. 18, the method may continue with filling the gaps 191A and the openings 1701 respectively with the dielectric 183 and the dielectric 179. The dielectric 183 and the dielectric 179 may be the same dielectric. The dielectric 183 and the dielectric 179 may be deposited by chemical vapor deposition (CVD), physical vapor deposition (PVD), a spin-on process, any other suitable process, combination thereof, or the like. Excess dielectric may be removed by a planarization process such as chemical mechanical polishing (CMP) or the like. The dielectric 183 and the dielectric 179 may extend through both the conductive layer 165 and the ILD layer 167. The dielectric 179 may be horizontally aligned to the DTI structures 141.

Figure 19:
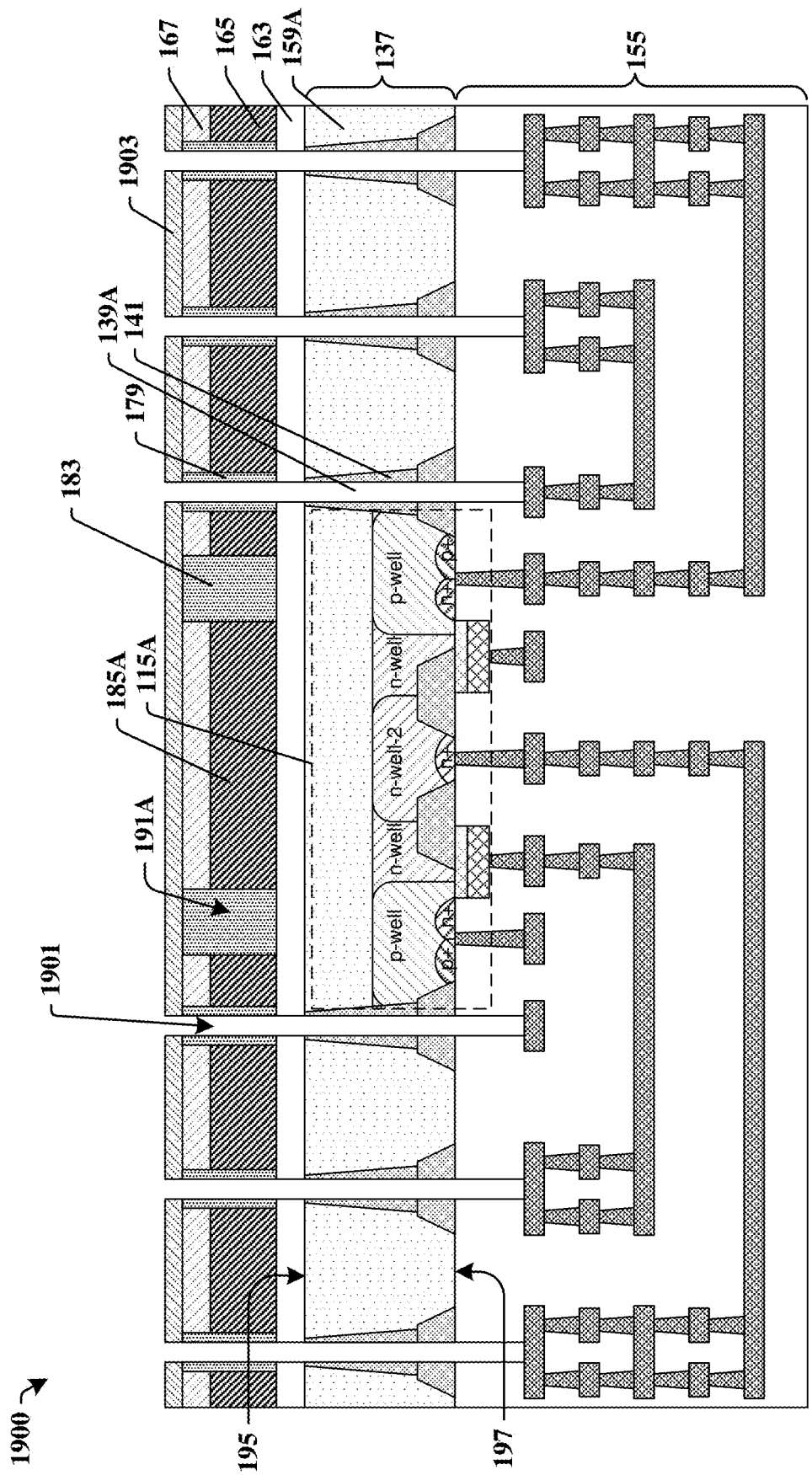

As shown by the cross-sectional view 1900 of FIG. 19, a mask 1903 may be formed and used to etch TSV openings 1901. The TSV openings 1901 may extend through the dielectric 179, through the insulating layer 163, through the semiconductor body 159A via the DTI structures 141, and into the metal interconnect structure 137 on the front side 197. The etching process may include wet etching, dry etching, reactive ion etching (RIE), some other etching process, a combination of the foregoing, or the like. After etching, the mask 1903 may be stripped.

Figure 20:
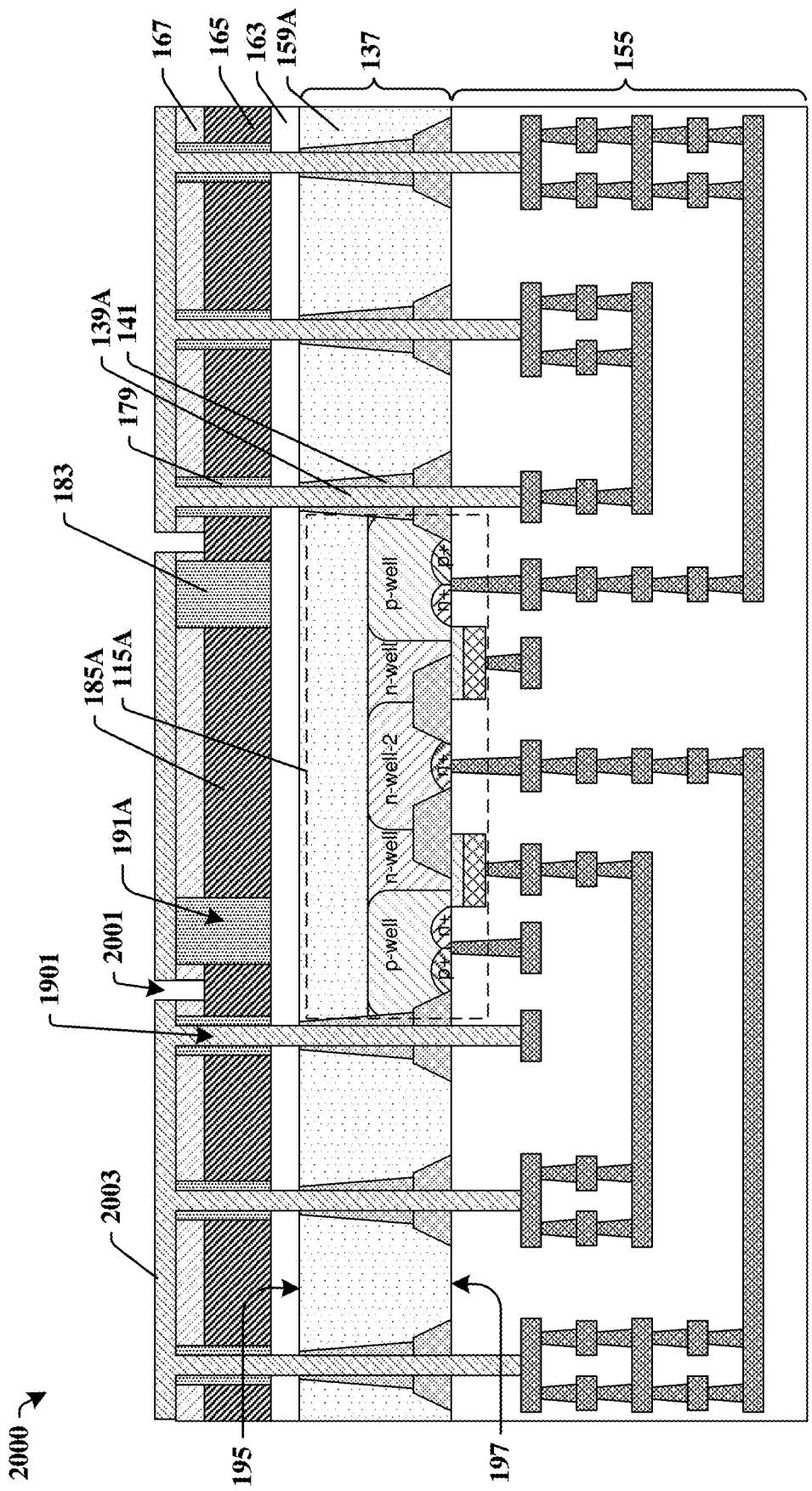

As shown by the cross-sectional view 2000 of FIG. 20, the method may continue with forming a mask 2003 and using it to etch via openings 2001 in the ILD layer 167. The backside electrode 185A is exposed through the via openings 2001. The etching may include wet etching, dry etching, reactive ion etching (RIE), some other etching process, a combination of the foregoing, or the like. It should be appreciated that the via openings 2001 may be formed before the TSV openings 1901, after the TSV openings 1901, or simultaneously with the TSV openings 1901. After etching, the mask 2003 may be stripped.

Figure 21:
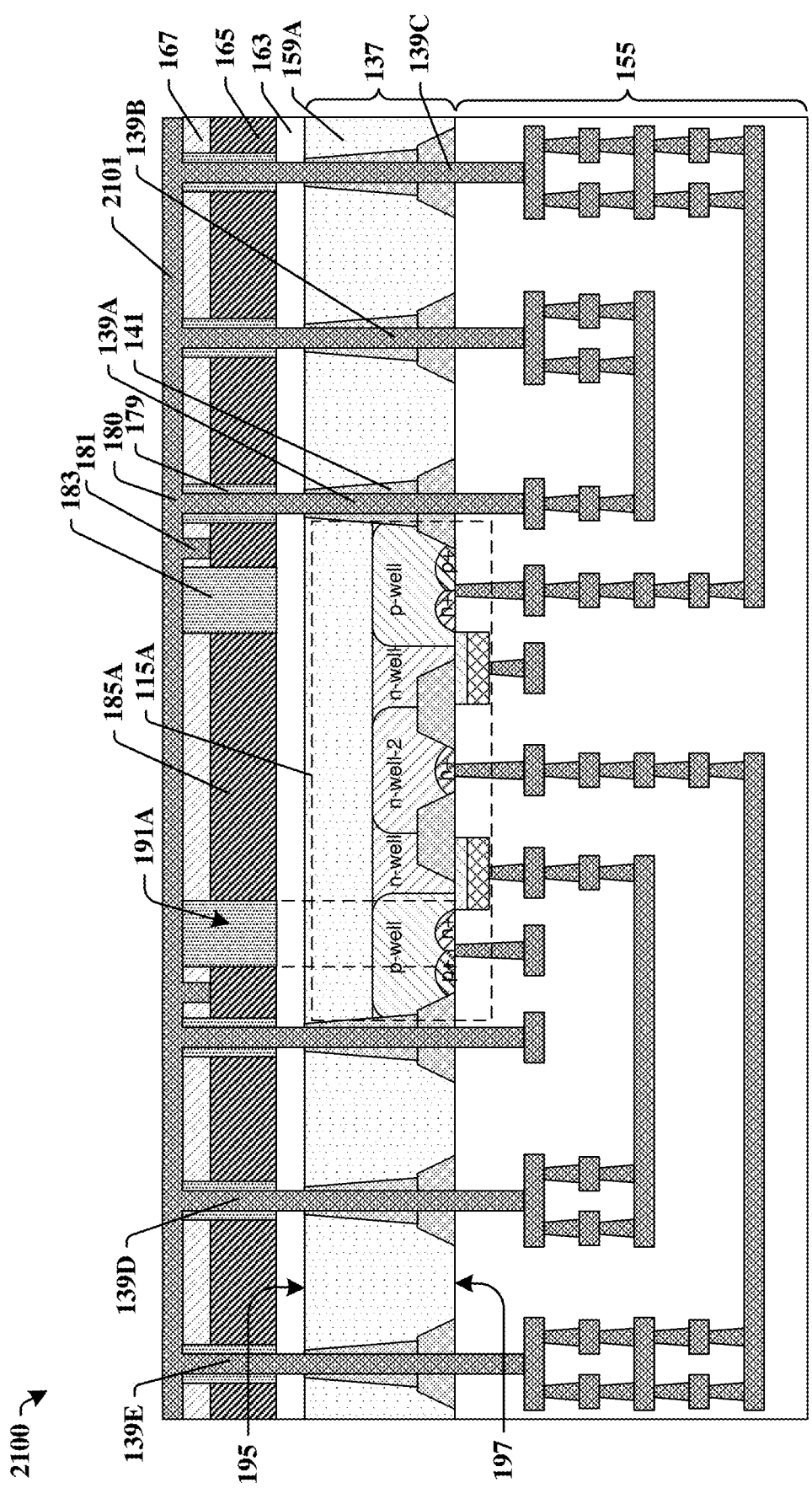

As shown by the cross-sectional view 2100 of FIG. 21, conductive material may be deposited to fill the via openings 2001 and the TSV openings 1901 and form a conductive layer 2101 on the backside 195. The conductive material may be metal, polysilicon, some other conductive material, a combination thereof, or the like. In some embodiments, the conductive material is metal. A suitable metal may be, for example, copper (Cu), aluminum (Al), gold (Au), silver (Ag), or platinum (Pt), a combination thereof, or the like. The conductive material may be deposited by CVD, PVD, electroplating plating, electroless plating, some other deposition process, combination thereof, or the like. The conductive material forms the TSVs 139A-139E and the vias 181.

Figure 22:
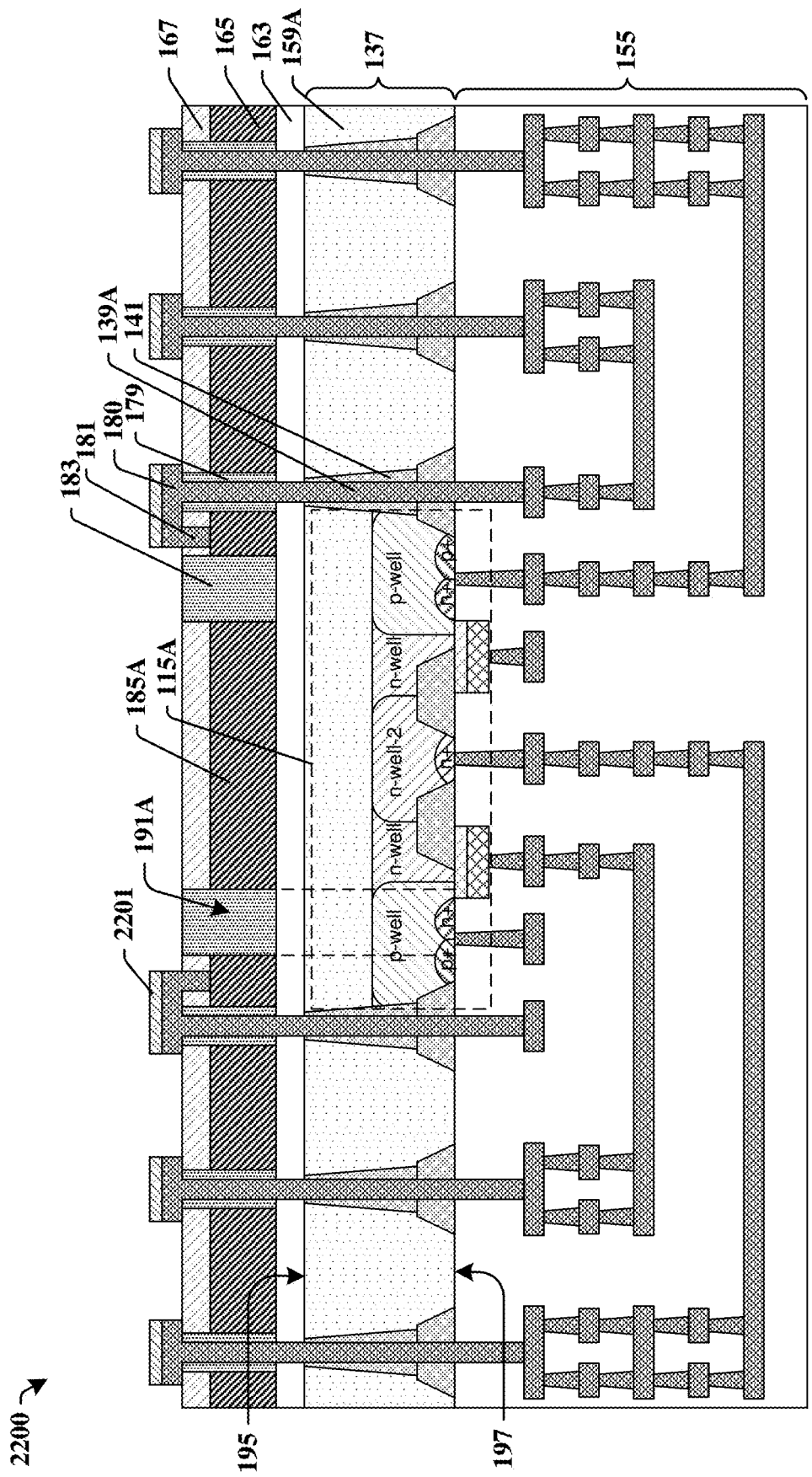

As shown by the cross-sectional view 2200 of FIG. 22, a mask 2201 may be formed and used to pattern the conductive layer 2101 to form conductive lines 180. Some of the conductive lines 180 may couple the vias 181 to the TSVs 139A. Others of the conductive lines 180 may couple the TSVs 139B-139E to contact pads or other structures on the backside 195. The etching may include wet etching, dry etching, reactive ion etching (RIE), some other etching process, a combination of the foregoing, or the like. Additional processing forms the ILD layer 169, the ILD layer 171 and the contact pads 175A-175D to provide a structure as the IC device 100A of FIG. 1A. After etching, the mask 2291 may be stripped.

FIGS. 23-29 are a series of cross-sectional views illustrating a variation on the process of FIGS. 10-22. In this variation, the gaps 191A are formed after the TSVs 139A-139E. Forming the gaps 191A after the TSVs 139A-139E may avoid contamination.

The variation begins as with the formation of the openings 1701 in the conductive layer 165. As shown by the cross-sectional view 2300 of FIG. 23, the openings 1701 are formed and the backside electrode 185A is patterned without simultaneously forming the gaps 191A as illustrated by the cross-sectional view 1700 of FIG. 17.

Figure 24:
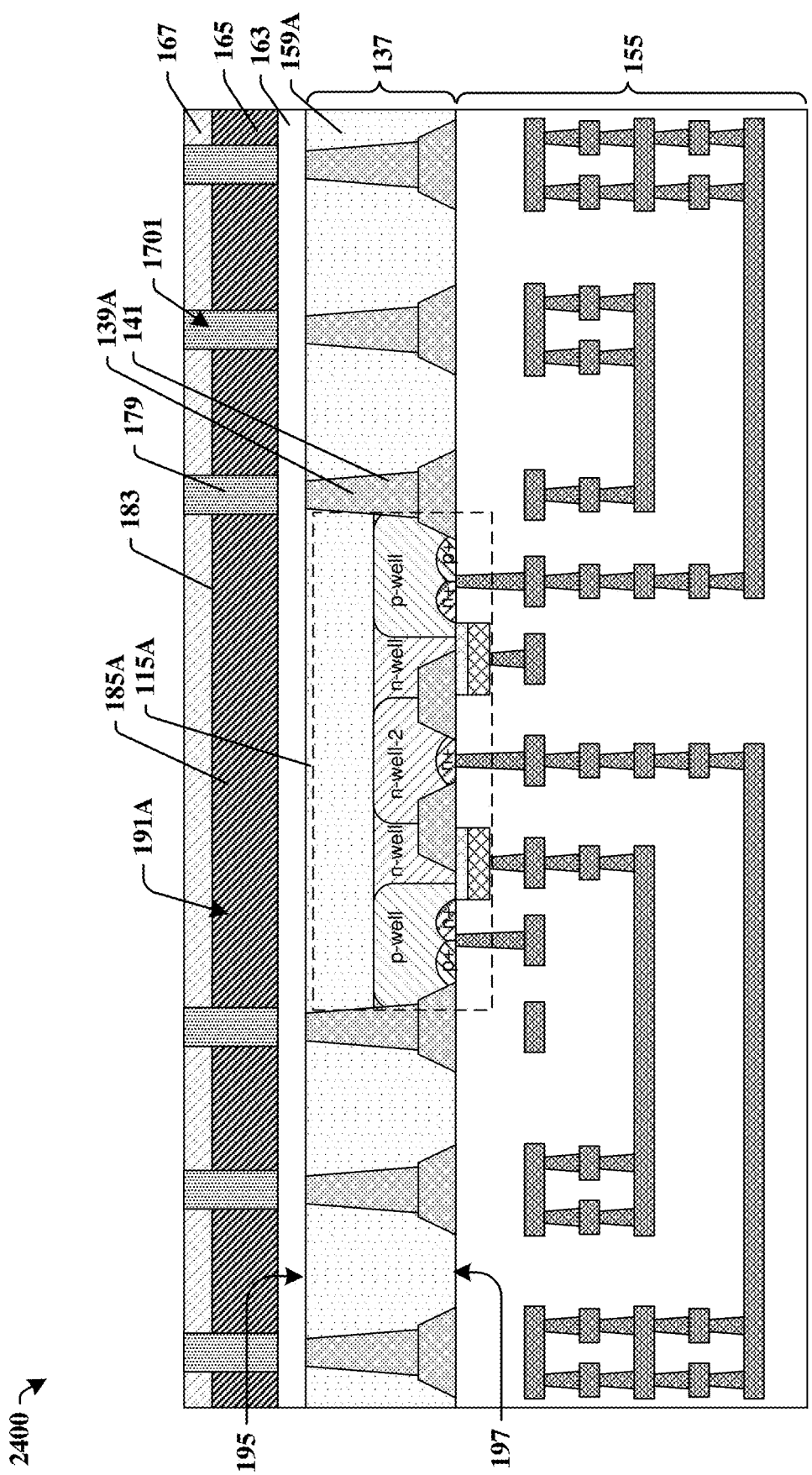
Figure 25:
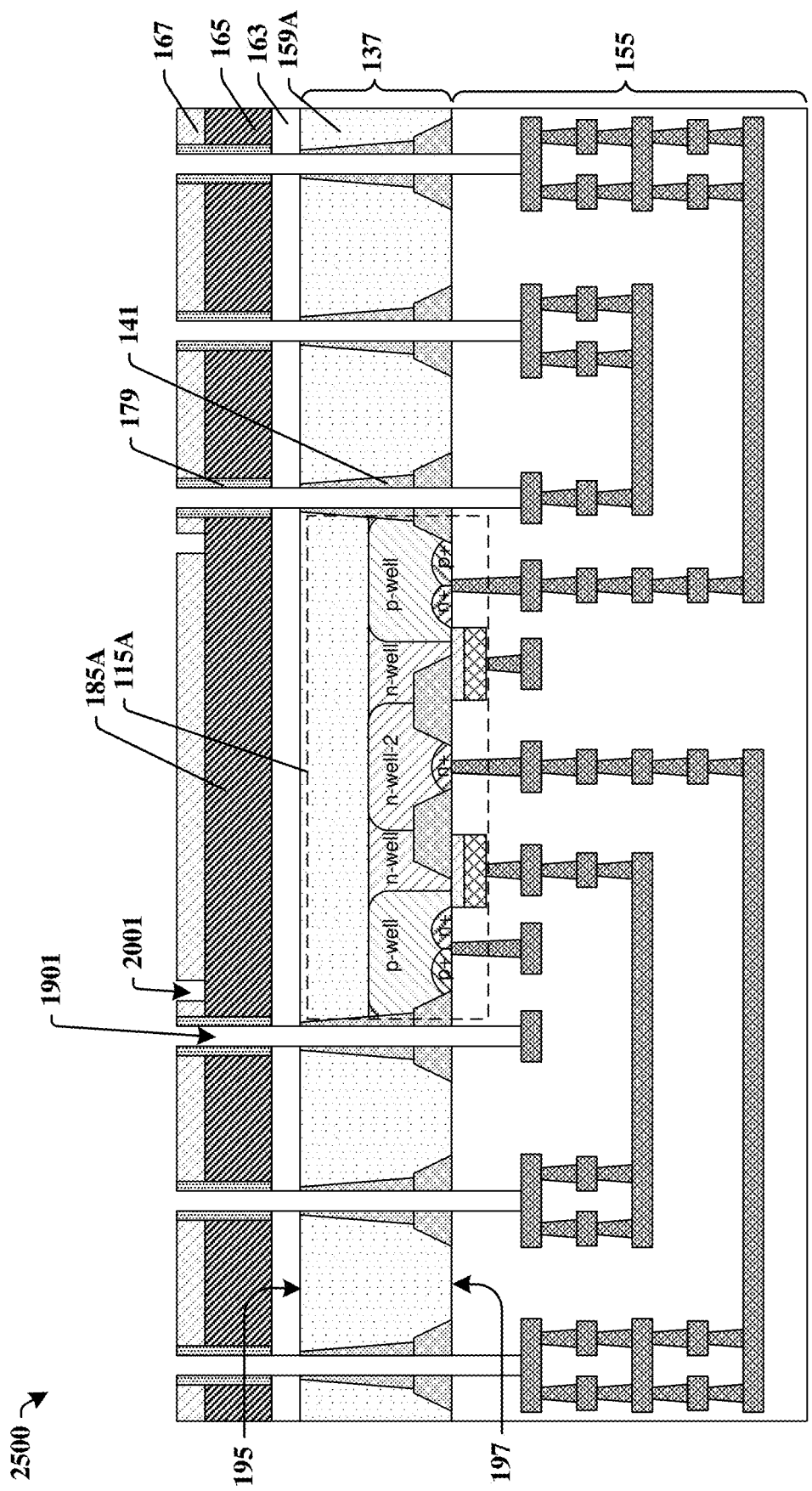
Figure 26:
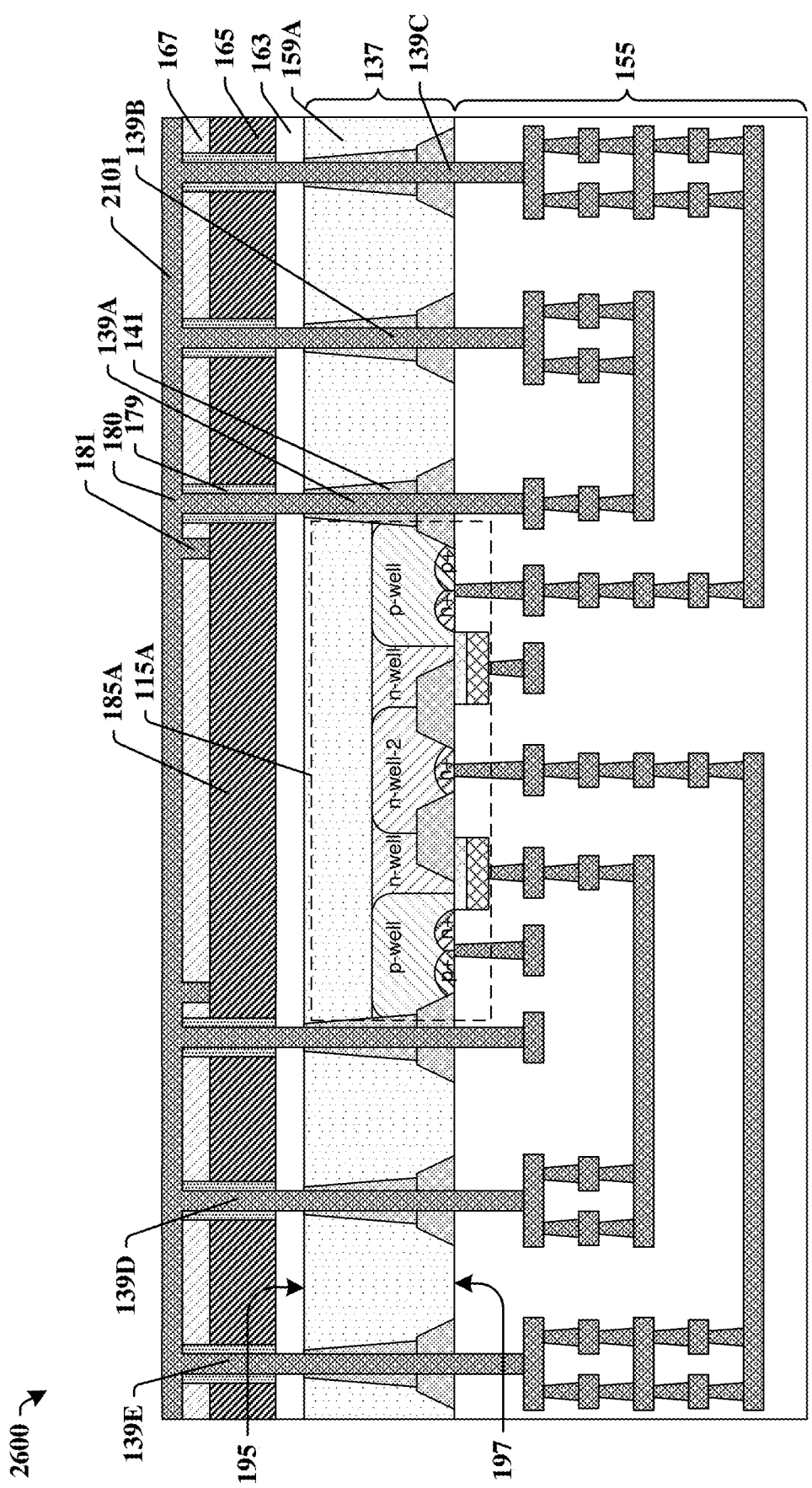
Figure 27:
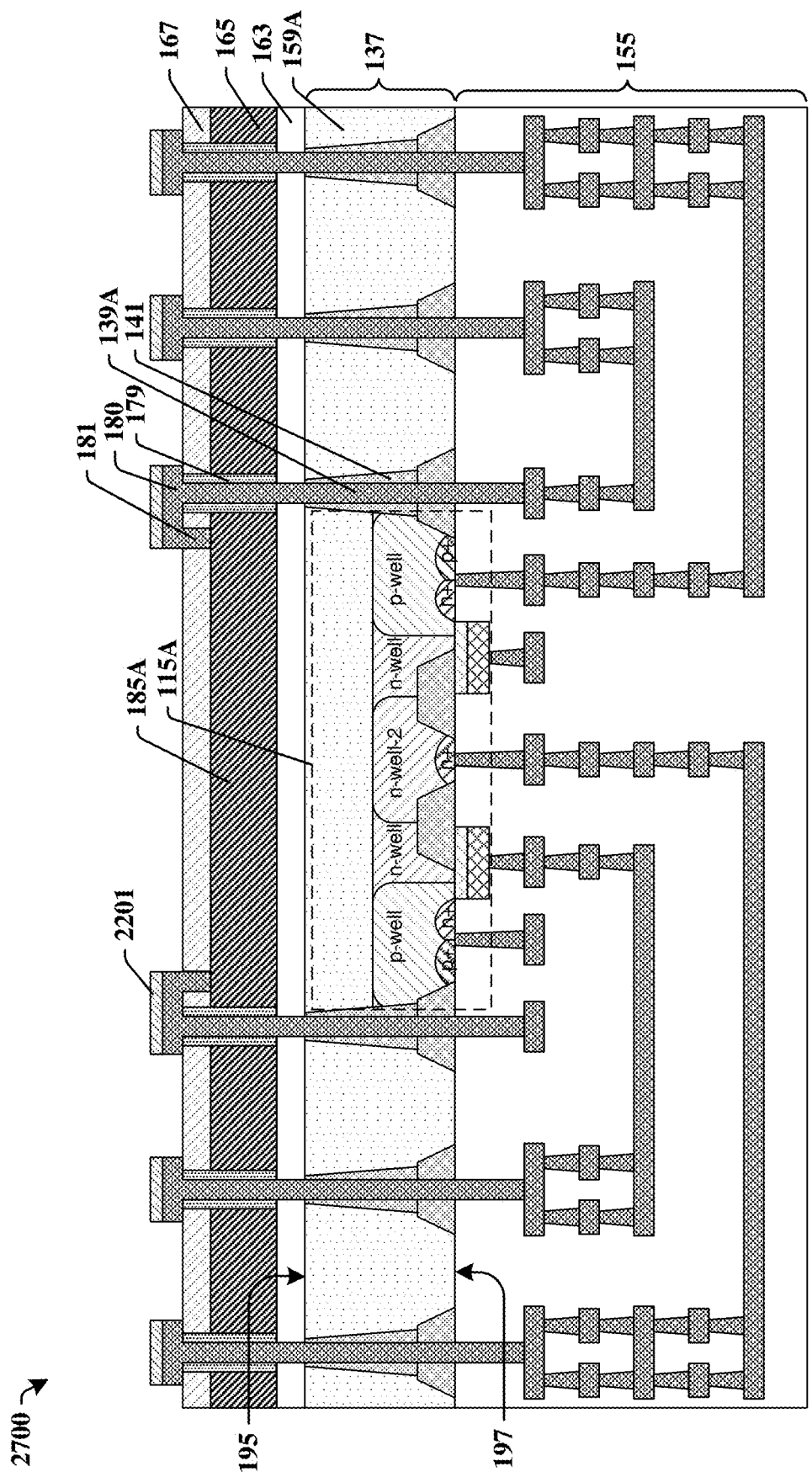

As shown by the cross-sectional view 2400 of FIG. 24, the variation continues with filling the openings 1701 with the dielectric 179 followed by etching the TSV openings 1901 and the via openings 2001 as shown by the cross-sectional view 2500 of FIG. 25. As shown by the cross-sectional view 2600 of FIG. 26, the conductive material is deposited to fill the via openings 2001 to form the vias 181, to fill the TSV openings 1901 to form the TSVs 139A-139E, and to form the conductive layer 2101. As shown by the cross-sectional view 2700 of FIG. 27, the conductive layer 2101 may then be patterned to form the conductive lines 180.

Figure 28:
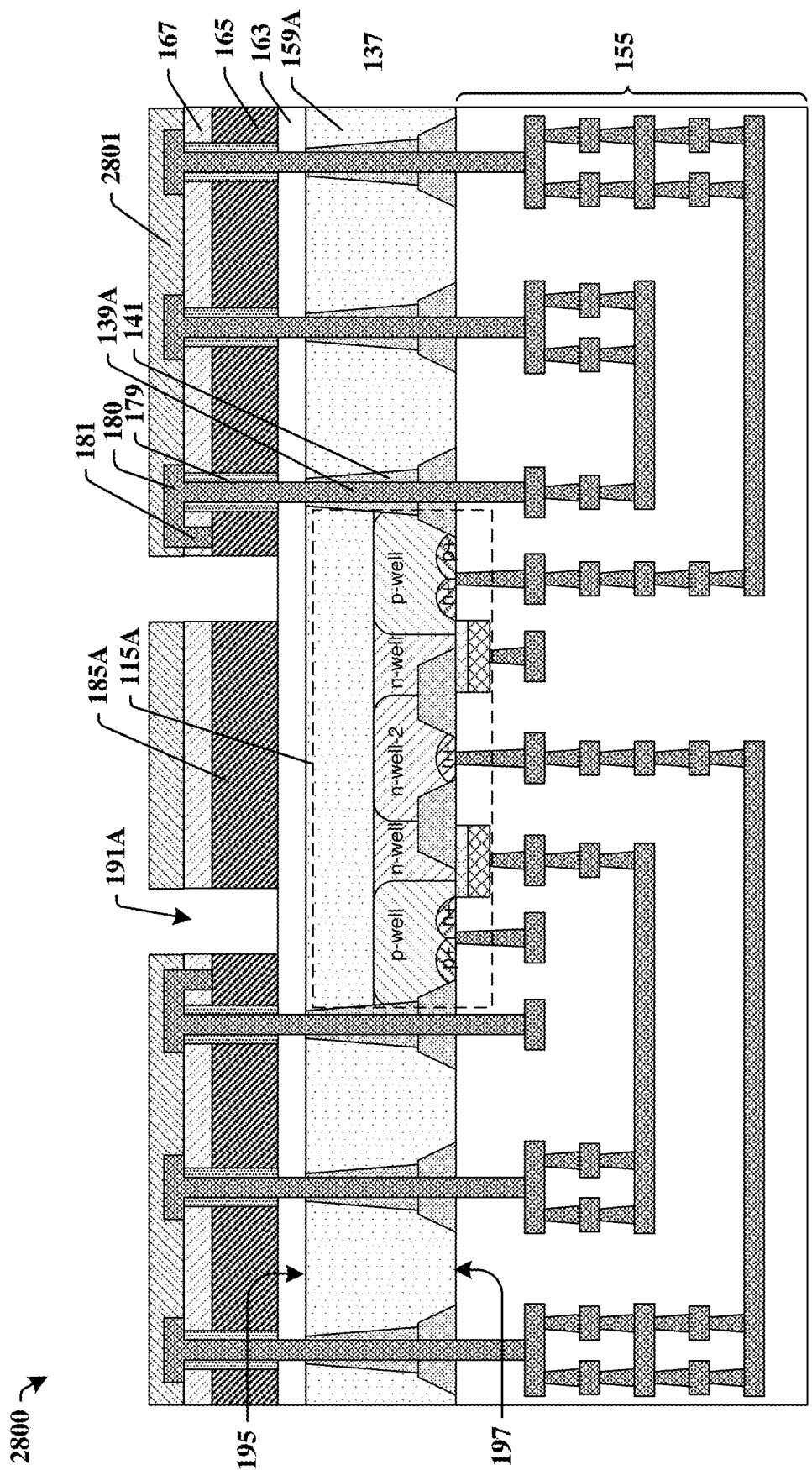

As shown by the cross-sectional view 2800 of FIG. 28, a mask 2801 may then be formed and used to etch the gaps 191A in the backside electrode 185A. After etching, the mask 2801 may be stripped. As shown by the cross-sectional view 2900 of FIG. 29, the gaps 191A may then be filled with dielectric 183. The dielectric 183 may be the same as or distinct from the dielectric 179. Excess dielectric 183 may be removed by a planarization process, such as CMP, stopping on the conductive lines 180. When this variation is used, the ILD layer 169 may have the same composition as the dielectric 183 that fills the gaps 191A.

FIGS. 30-35 are a series of cross-sectional views illustrating another variation on the process of FIGS. 10-22. In this variation, the backside electrode 185A is formed by a damascene process whereby etching of the conductive layer 165 may be avoided.

Figure 30:
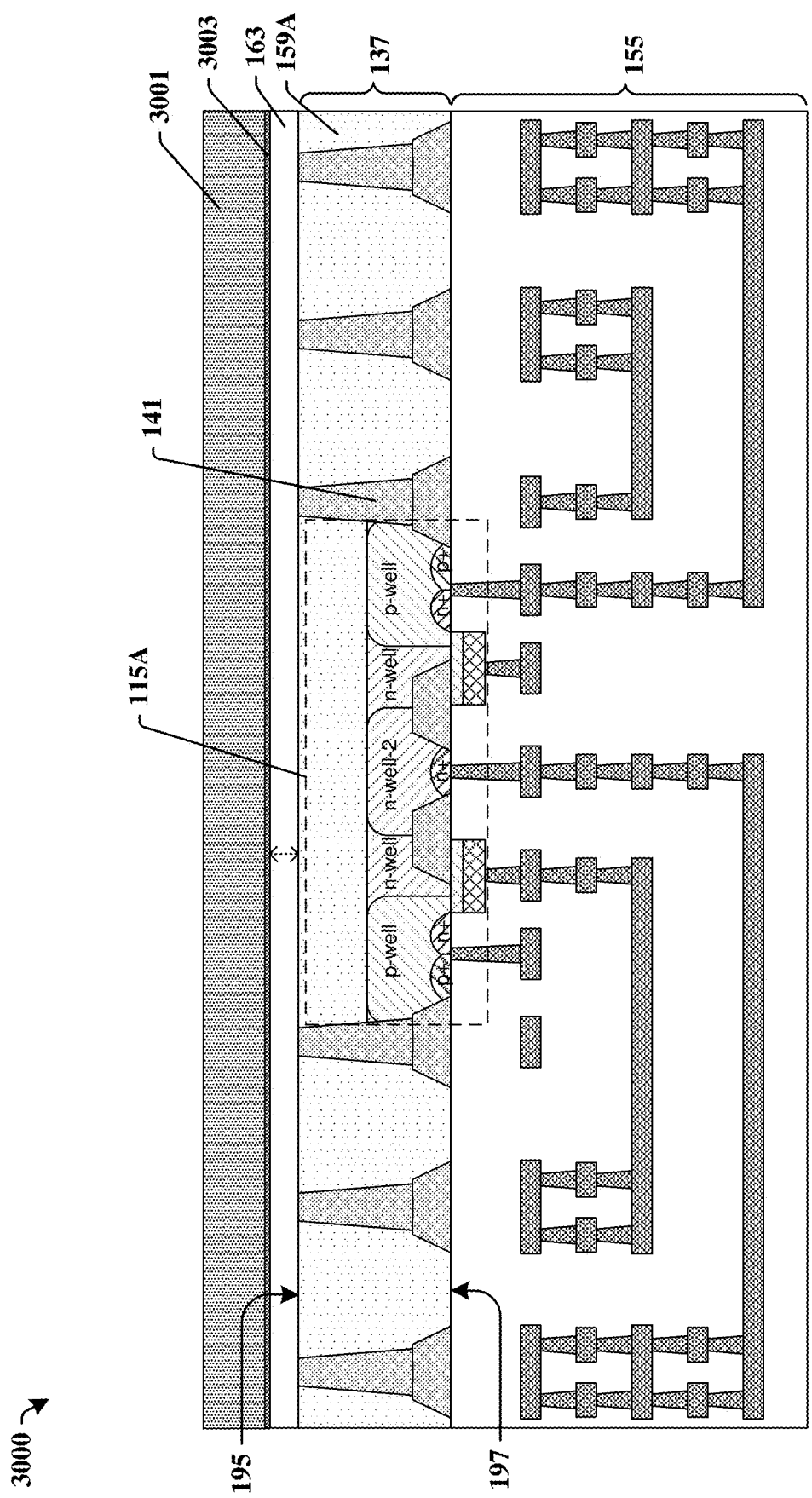
FIGS. 30-34 illustrate in a series of cross-sectional views a variation on the method of FIGS. 10-22 in accordance with some other aspects of the present disclosure.

As shown by the cross-sectional view 3000 of FIG. 30, an etch stop layer 3003 and a dielectric layer 3001 may be deposited over the insulating layer 163. The etch stop layer 3003 is optional. In some embodiments, the etch stop layer 3003 is a nitride (e.g., SiN), a carbide (e.g., SiC), an oxy-nitride (e.g., SiON), an oxy-carbide (e.g., SiOC), a combination thereof, or the like. The dielectric layer 3001 is a material of the dielectric 183 that fills the gaps 191A.

Figure 31:
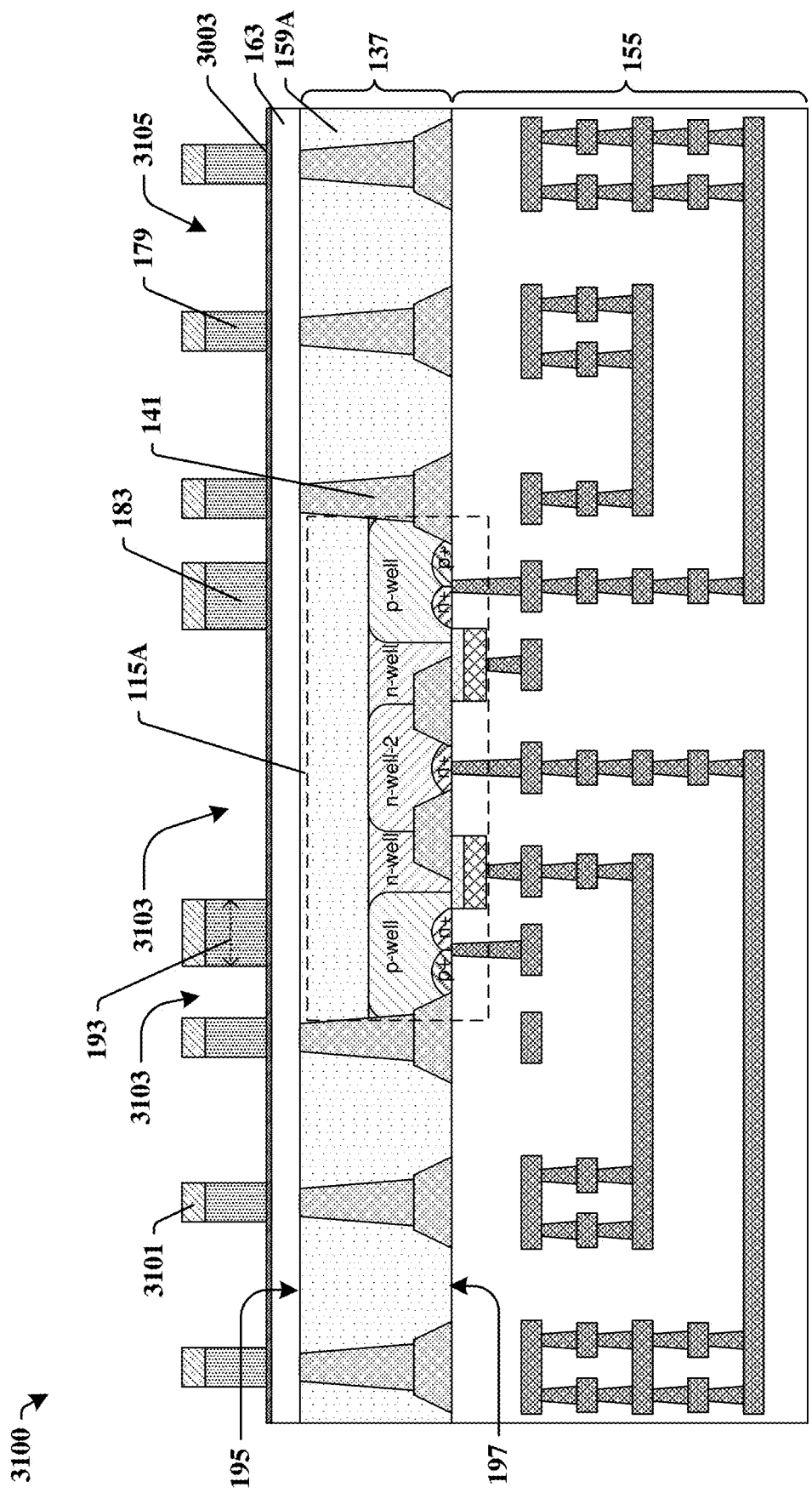

As shown by the cross-sectional view 3100 of FIG. 31, a mask 3101 may be formed and used to pattern the dielectric layer 3001 to form openings 3103 to provide a mold for the backside electrode 185A and additional openings 3105 at other locations where the conductive layer 165 is desired. Forming the openings 3103 and 3105 may include etching for which the etch stop layer 3003 provides an endpoint.

Figure 32:
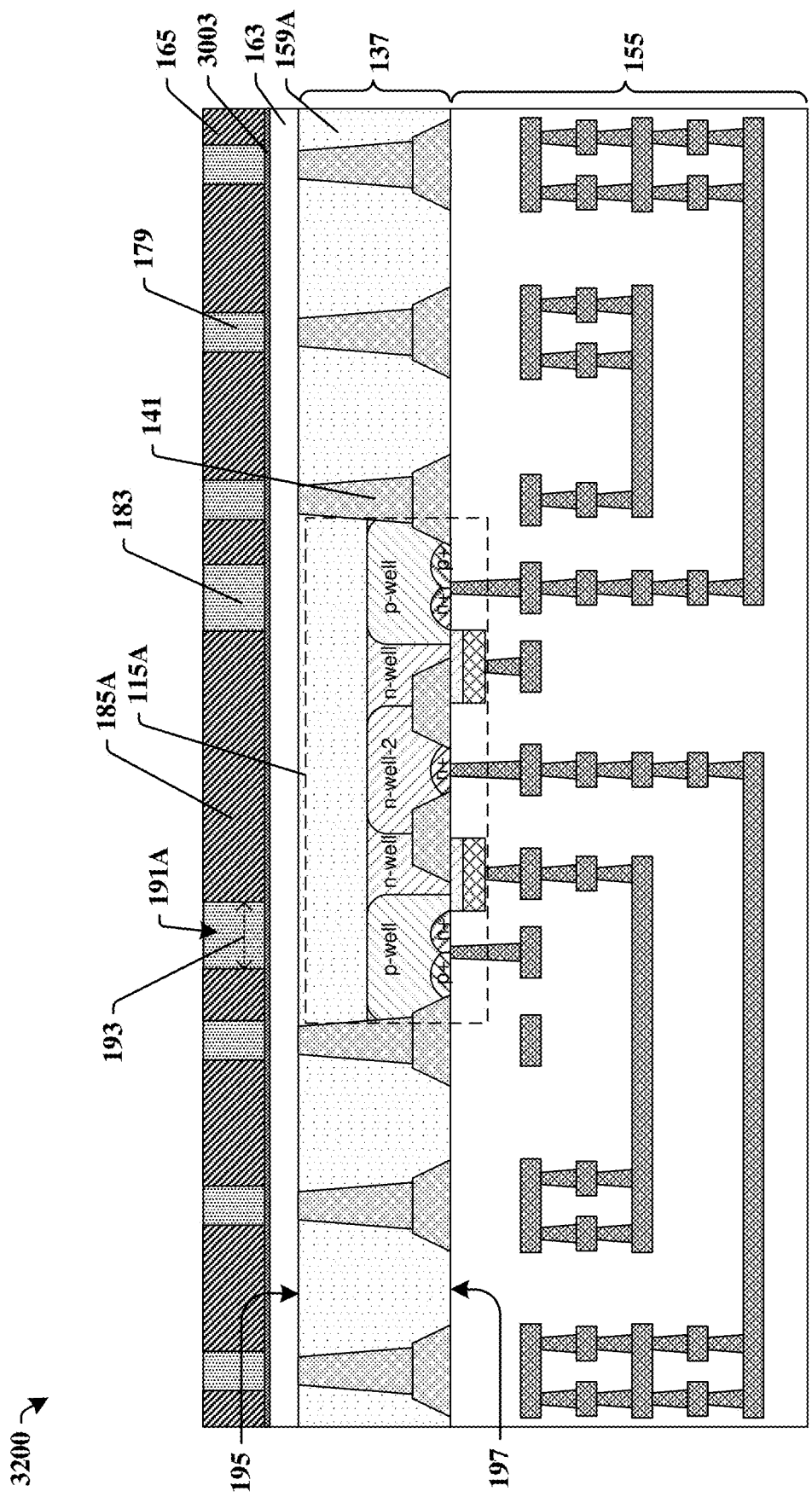

As shown by the cross-sectional view 3200 of FIG. 32, the mask 3101 may be stripped and the conductive material deposited to fill the openings 3103 and 3105. Any excess conductive material may be removed by a planarization process such as CMP. The conductive material that fills the openings 3103 forms the backside electrode 185A and the conductive material that fills the openings 3105 forms the remainder of the conductive layer 165.

Figure 33:
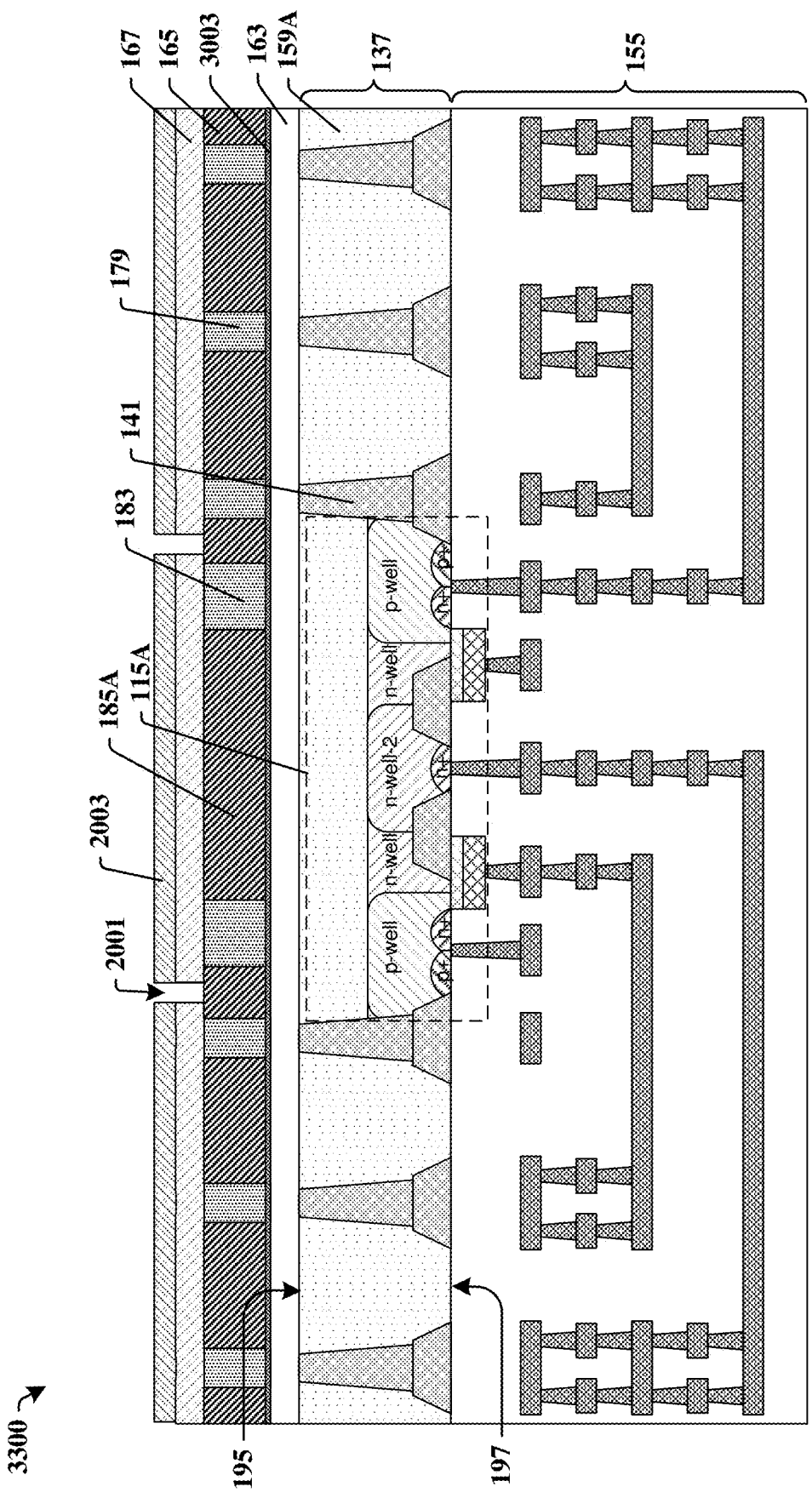
Figure 34:
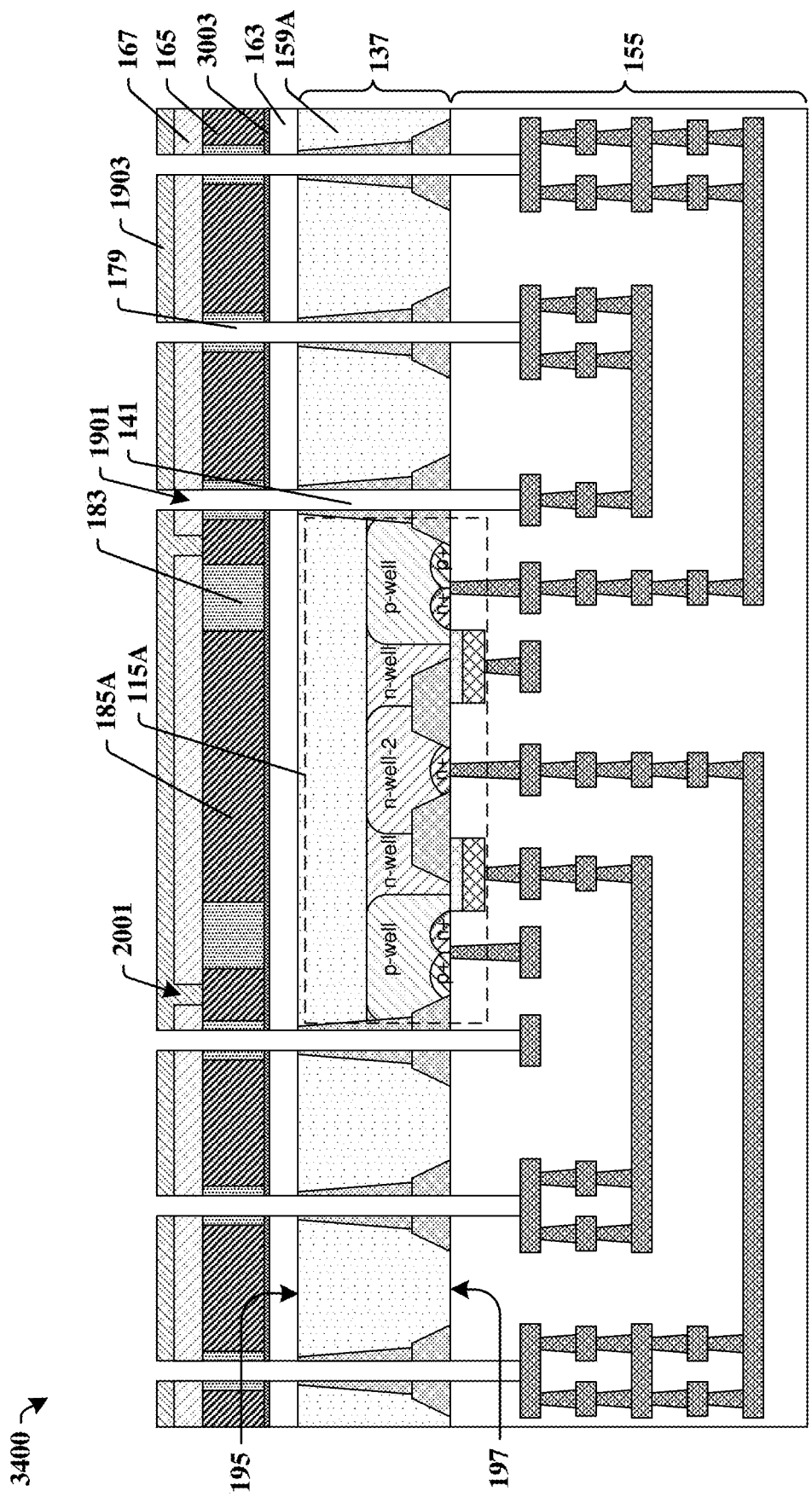

As shown by the cross-sectional view 3300 of FIG. 33, the ILD layer 167 may then be formed and patterned with via openings 2001. As shown by the cross-sectional view 3400 of FIG. 34, the TSV openings 1901 may then be etched. Processing may continue as illustrated by the cross-sectional views 2600-2900 of FIG. 26 through FIG. 29. In the resulting IC device, the etch stop layer 3003 may be disposed between the backside electrode 185A and the insulating layer 163.

FIG. 35 presents a flow chart for a process 3500 which may be used to form an IC device according to the present disclosure. While the process 3500 of FIG. 35 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 3500 may begin with act 3501, forming DTI structures and act 3503, forming lightly doped wells. The cross-sectional view 1000 of FIG. 10 provides an example of the resulting structure. The process continues with act 3505, forming STI structures. The cross-sectional view 1100 of FIG. 11 provides an example of the resulting structure. Act 3507 is forming medium doped wells. The cross-sectional view 1200 of FIG. 12 provides an example of the resulting structure.

Act 3509 is forming gates on the front side. Act 3511 is forming heavily doped contact regions. These processes are illustrated by the cross-sectional view 1300 of FIG. 13. Act 3513 is forming a metal interconnect structure on the front side. The cross-sectional view 1400 of FIG. 14 provides an example of the resulting structure. Act 3515 is thinning the substrate to the device layer. The cross-sectional view 1500 of FIG. 15 provides an example of the resulting structure.

Act 3517 is forming the isolation layer on the backside. Act 3519 is forming the conductive layer on the isolation layer. Act 3521 is forming an ILD layer on the conductive layer. The cross-sectional view 1600 of FIG. 16 provides an example of the resulting structure.

Act 3523 is patterning the backside conductive layer. This patterning defines the backside electrodes from the backside conductive layer. In some embodiments, this patterning also forms openings in the backside electrodes. This patterning may also provide openings in the backside conductive layer to allow passage of the TSVs through the backside conductive layer without contacting the backside conductive layer. The cross-sectional view 1700 of FIG. 17 provides an example of the resulting structure.

Act 3525 is filling the openings in the backside conductive layer with dielectric. The cross-sectional view 1800 of FIG. 18 provides an example of the resulting structure. Act 3527 is forming TSV openings. The cross-sectional view 1900 of FIG. 19 provides an example of the resulting structure. Act 3529 is forming openings for vias that connect to the backside electrode. The cross-sectional view 2000 of FIG. 20 provides an example of the resulting structure. Act 3529 is depositing metal that forms the TSVs, the backside electrode vias, and a backside metal layer. The cross-sectional view 2100 of FIG. 21 provides an example of the resulting structure.

Act 3531 is patterning the backside metal. The patterned metal forms connections between the backside electrode vias and some of the TSVs, may form connections between other TSVs and other structures on the backside, and may further interconnect structures on the backside. The cross-sectional view 2200 of FIG. 22 provides an example of the resulting structure. Act 3535 is forming the backside contacts and related structures. FIG. 1A. provides an example of the resulting structure.

Figure 36:
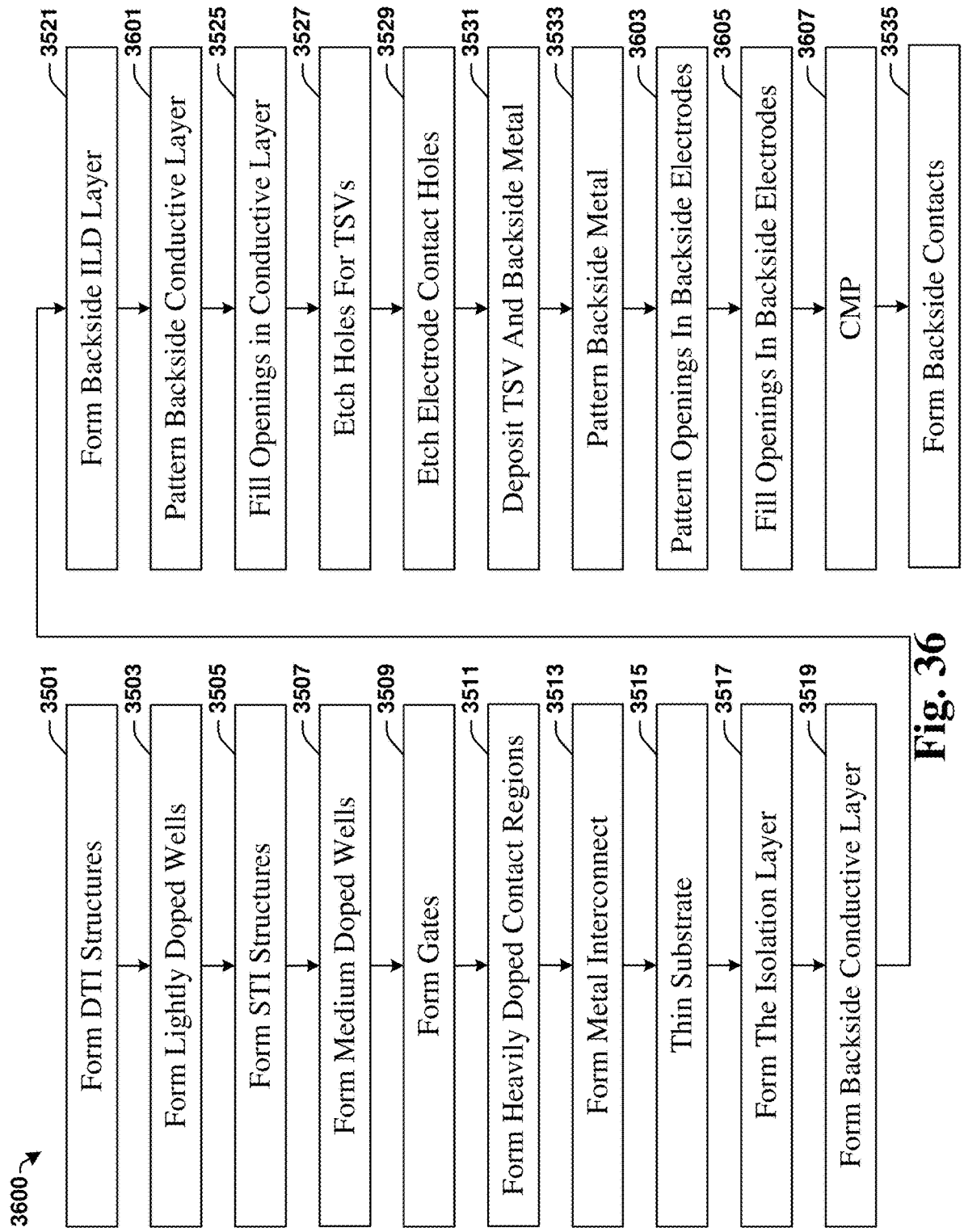

FIG. 36 presents a flow chart for a process 3600 which is a variation of the process 3500 of FIG. 35 and may be used to form similar IC devices. In this variation, the openings in the backside electrodes are formed after the TSVs.

Figure 23:
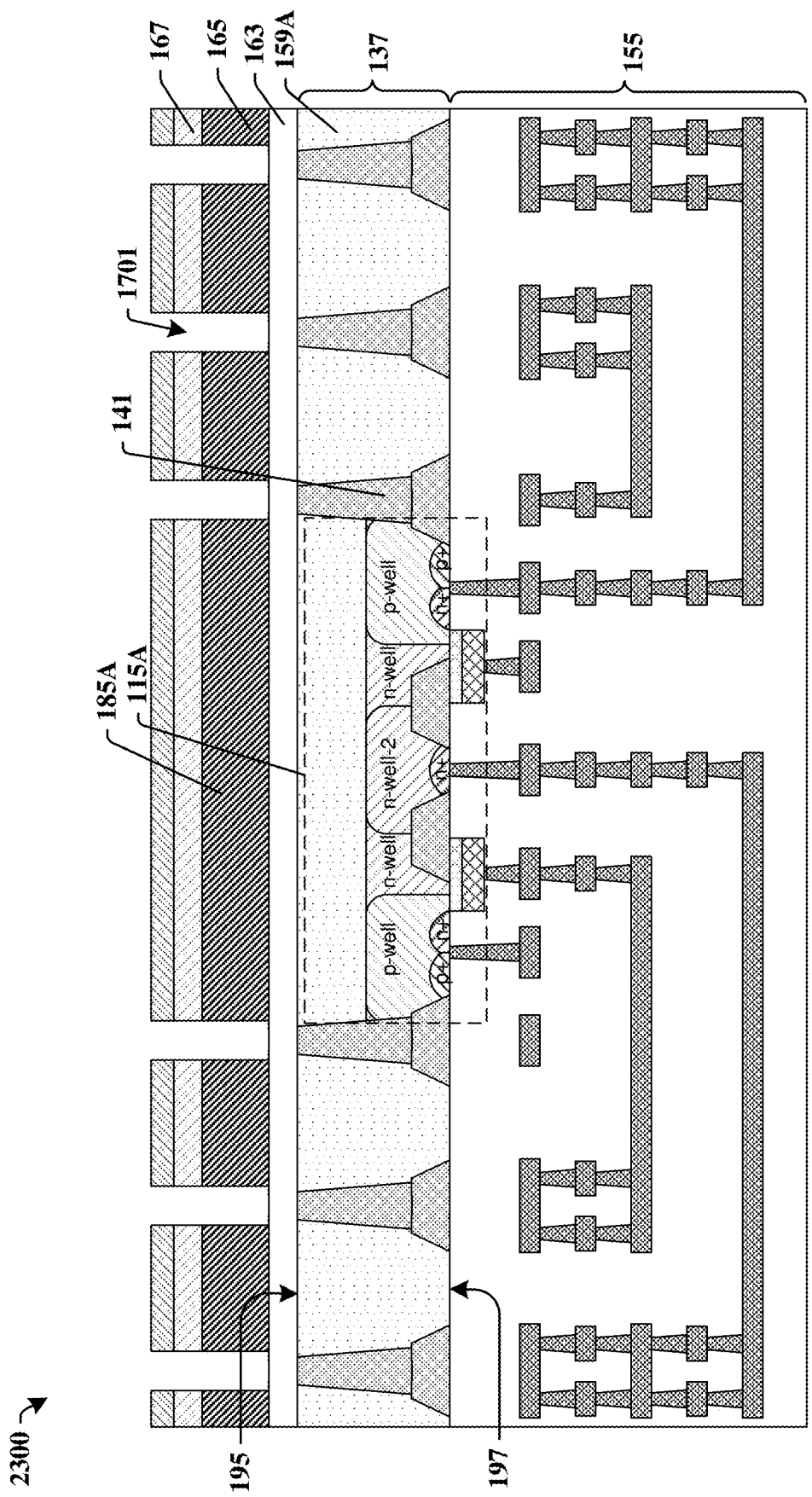
FIGS. 23-29 illustrate in a series of cross-sectional views a variation on the method of FIGS. 10-22 in accordance with some other aspects of the present disclosure.

The process 3600 include many of the same acts as the process 3500. The variation begins with act 3601, patterning the backside conductive layer. Act 3601 is similar to act 3523 except that act 3601 does not include etching openings in the backside electrode. The cross-sectional view 2300 of FIG. 23 provides an example of the resulting structure.

The next variation occurs with act 3603, which is patterning the openings in the backside electrodes. In the process 3600, act 3603 follows act 3533, patterning the backside metal. The cross-sectional view 2800 of FIG. 28 provides an example of the resulting structure.

Figure 29:
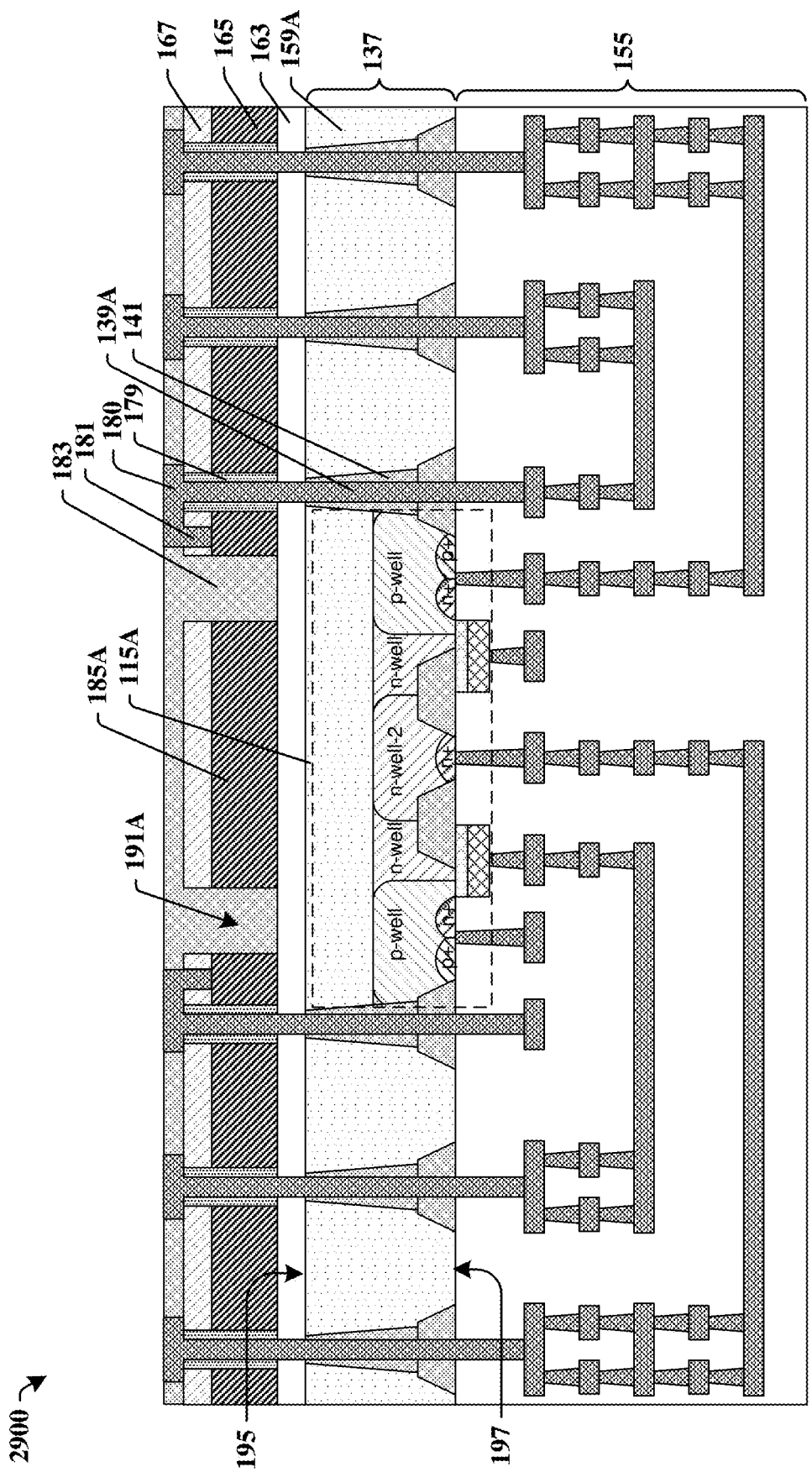

The process 3600 continues with act 3605, filling the openings in the backside electrodes with dielectric and act 3607, CMP to remove excess dielectric. The cross-sectional view 2900 of FIG. 29 provides an example of the resulting structure. The backside contacts may then be formed as in the process 3500.

Figure 37:
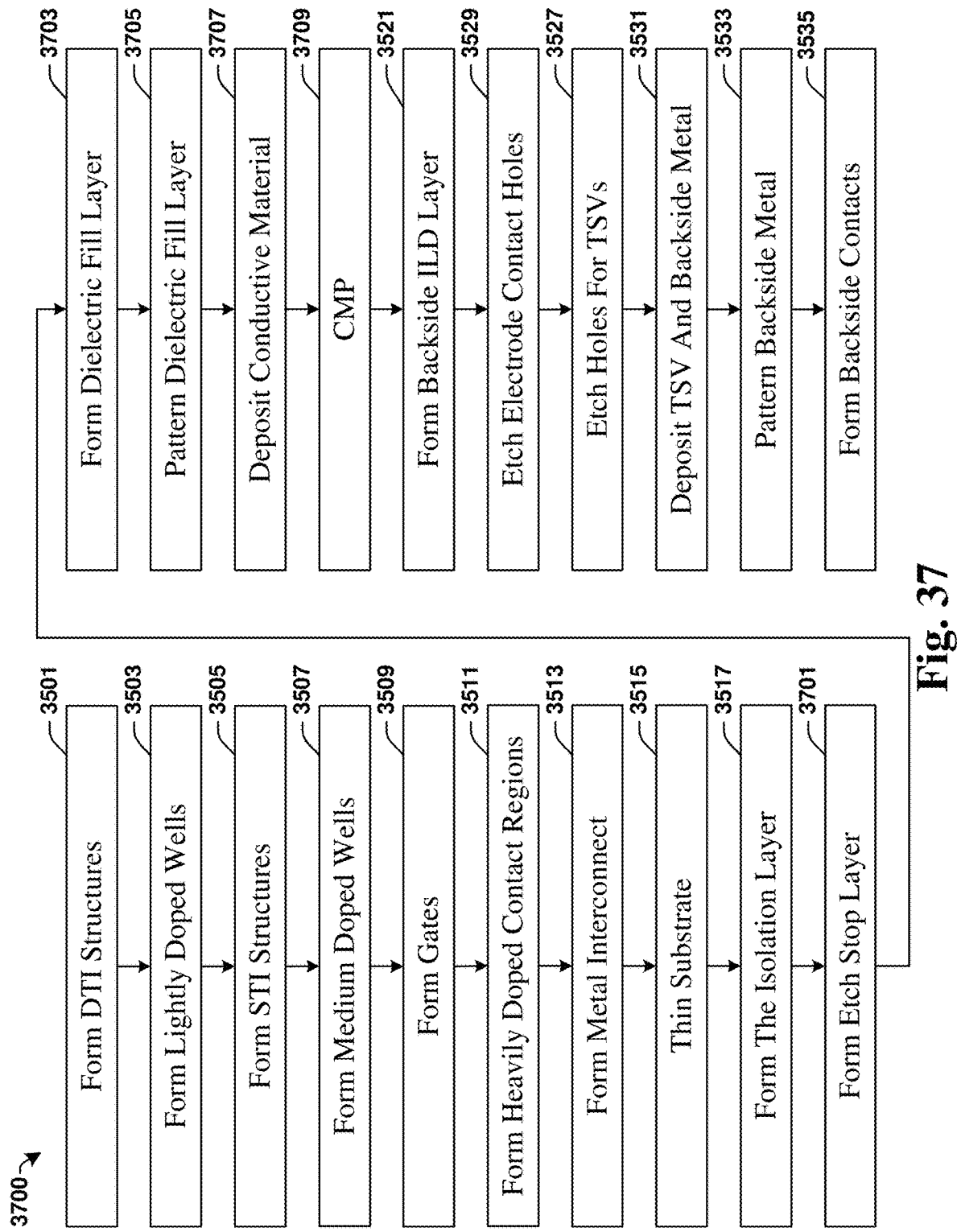

FIG. 37 presents a flow chart for a process 3700 which is another variation of the process 3500 of FIG. 35 and may also be used to form similar IC devices. In this variation, the backside electrode and its openings are formed using a damascene process.

The process 3700 include many of the same acts as the process 3500. The variation may begin with act 3701, forming an etch stop layer on the isolation layer. This act is optional if the etch stop layer is not needed. Act 3703 is forming a dielectric fill layer, which is the dielectric that fills the openings in the backside electrode. The cross-sectional view 3000 of FIG. 30 provides an example of the resulting structure. Act 3705 is patterning the dielectric fill layer. The cross-sectional view 3100 of FIG. 31 provides an example of the resulting structure.

Act 3707 is depositing the conductive material for the backside electrode. Act 3709 is chemical mechanical polishing, which may remove any of the conductive material that deposits outside the openings in the dielectric fill layer. The cross-sectional view 3200 of FIG. 32 provides an example of the resulting structure.

The process may continue as does process 3500. Optionally, act 3529, etching electrode contact holes precedes act 3527, etching holes for the TSVs. This process sequence is illustrated by the cross-sectional views 3300 and 3400 of FIGS. 33 and 34.

Some aspects of the present disclosure relate to an IC device that includes a semiconductor body having a front side and a backside. A HVSD is disposed on the front side. A conductive layer and an insulating layer are disposed on the backside. The insulating layer is between the conductive layer and the semiconductor body. The conductive layer forms an electrode directly beneath the HVSD. The electrode has a gap directly beneath the HVSD. In some embodiments, a first portion of the electrode is on a first side of the gap and a second portion of the electrode is on a second side of the gap, opposite the first side of the gap. In some embodiments, the first portion and the second portion are united. In some embodiments, the gap is longer than the HVSD.

In some embodiments, an area of the electrode directly underneath the HVSD is greater than an area of the gap directly underneath the HVSD. In some embodiments, the gap has a shape that corresponds to a shape of a source region, a drain region, a gate electrode, or a channel that is part of the HVSD and is on the front side. In some embodiments, the HVSD has a source region and a drain region that are elongated in a transverse direction to a source-to-drain direction and the gap is also elongated in the transverse direction. In some embodiments, the gap has a width that is from one to ten times a thickness of the insulating layer. In some embodiments, the gap is one of a plurality of gaps in the electrode and directly beneath the HVSD. In some embodiments, the HVSD is a transistor. In some embodiments, the gap is directly beneath a source region, a drain region, or a gate electrode of the transistor. In some embodiments, the gap is directly beneath a PN junction of the transistor.

Some aspects of the present disclosure relate to an IC device that includes a semiconductor body. A plurality of high voltage devices formed in the semiconductor body and having a footprint beneath the semiconductor body. There is an insulating layer under the semiconductor body and one or more electrodes beneath the insulating layer. The one or more electrodes extend over part but not all of each of the footprints and have a pattern that repeats within each of the footprints. In some embodiments, the pattern comprises a gap surrounded by a one of the one or more electrodes. In some embodiments, each of the one or more electrodes is entirely within an outer perimeter of a deep trench isolation structures that surrounds one of the plurality of high voltage devices. In some embodiments, each of the one or more electrodes has a pair of sidewalls separated by a dielectric and directly beneath one of the plurality of high voltage devices. In some embodiments, the electrodes are longer than the high voltage devices.

Some aspects of the present disclosure relate to a method that includes forming a high voltage semiconductor device on a front side of a semiconductor body and forming an insulating layer and a conductive layer on a backside of the semiconductor body. The insulating layer is between the conductive layer and the semiconductor body. The conductive layer is etched to define an electrode directly beneath the HVSD and an opening in the electrode. The opening is directly beneath the HVSD. In some embodiments, the method further includes forming a metal interconnect structure on the front side of the semiconductor body, forming a through-substrate via, and connecting the electrode to the metal interconnect structure through the through-substrate via. In some embodiments, the method further includes biasing the electrode to increase a breakdown voltage of the HVSD.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a high voltage semiconductor device (HVSD) on a front side of a semiconductor body; and
forming an insulating layer and a conductive layer on a backside of the semiconductor body, wherein the insulating layer is between the conductive layer and the semiconductor body; and
etching the conductive layer to define a contiguous electrode directly beneath the HVSD and an opening in the contiguous electrode;
wherein the opening is directly beneath the HVSD.

2. The method of claim 1, further comprising:
forming a metal interconnect structure on the front side of the semiconductor body;
forming a through-substrate via; and
connecting the contiguous electrode to the metal interconnect structure through the through-substrate via.

3. The method of claim 1, further comprising biasing the contiguous electrode to increase a breakdown voltage of the HVSD.

4. The method of claim 3, wherein the increase in the breakdown voltage is enhanced by the opening.

5. The method of claim 1, wherein the contiguous electrode has two or more openings directly beneath the HVSD.

6. The method of claim 1, wherein the opening is a cut-out within the contiguous electrode.

7. A method, comprising:
providing a semiconductor body having a first side and a second side, wherein the second side is opposite the first side across a thickness of the semiconductor body;
forming a high voltage semiconductor device on the first side of the semiconductor body;
forming a contiguous electrode on or in a dielectric layer on the second side of the semiconductor body, wherein the contiguous electrode is insulated from the semiconductor body by the dielectric layer, the contiguous electrode is directly opposite the high voltage semiconductor device, and the contiguous electrode has sidewalls that define a gap that is directly opposite the high voltage semiconductor device;

a first portion of the contiguous electrode is on a first side of the gap; and a second portion of the contiguous electrode is on a second side of the gap, opposite the first side of the gap.

8. The method of claim 7, wherein the gap is longer than the high voltage semiconductor device.

9. The method of claim 7, wherein an area of the contiguous electrode directly underneath the high voltage semiconductor device is greater than an area of the gap directly underneath the high voltage semiconductor device.

10. The method of claim 7, wherein the gap has a shape that corresponds to a shape of a source region, a drain region, a gate electrode, or a channel that is part of the high voltage semiconductor device and is on the first side.

11. The method of claim 7, wherein:
the high voltage semiconductor device has a source region and a drain region that are elongated in a transverse direction to a source-to-drain direction; and
the gap is elongated in the transverse direction.

12. The method of claim 7, wherein the high voltage semiconductor device is a lateral doubly diffused metal oxide semiconductor (LDMOS) device.

13. The method of claim 7, wherein the high voltage semiconductor device is a transistor, and the gap increases a breakdown voltage of the transistor.

14. The method of claim 7, further comprising forming a deep trench isolation structure, wherein the deep trench isolation structure surrounds the high voltage semiconductor device and extends from the first side and a second side.

15. The method of claim 7, wherein the contiguous electrode surrounds the gap.

16. A method, comprising:
forming a plurality of high voltage semiconductor devices on a first side of a semiconductor body, wherein the high voltage semiconductor devices have footprints; and forming a plurality of contiguous electrodes on a second side of the semiconductor body, wherein the contiguous electrodes extend over some but not all of the footprints of corresponding high voltage semiconductor devices in a pattern that is repeated for each of the plurality of high voltage semiconductor devices;

wherein a dielectric layer separates the plurality of contiguous electrodes from the semiconductor body; and each of the plurality of contiguous electrodes has internal sidewalls.

17. The method of claim 16, wherein the internal sidewalls define a gap surrounded by a one of the plurality of contiguous electrodes.

18. The method of claim 16, wherein:
each of the plurality of high voltage semiconductor devices is surrounded by a distinct deep trench isolation structure; and
each of the plurality of contiguous electrodes is entirely within an outer perimeter of one of the deep trench isolation structures.

19. The method of claim 16, wherein each of the plurality of contiguous electrodes has a pair of the internal sidewalls separated by a dielectric within the respective footprint.

20. The method of claim 16, wherein each of the plurality of contiguous electrodes is longer than a respective one of the plurality of high voltage semiconductor devices.

* * * * *